United States Patent [19]
Takasu

[11] Patent Number: 5,307,305
[45] Date of Patent: Apr. 26, 1994

[54] SEMICONDUCTOR DEVICE HAVING FIELD EFFECT TRANSISTOR USING FERROELECTRIC FILM AS GATE INSULATION FILM

[75] Inventor: Hidemi Takasu, Kyoto, Japan
[73] Assignee: Rohm Co., Ltd., Kyoto, Japan
[21] Appl. No.: 984,312
[22] Filed: Dec. 1, 1992

[30] Foreign Application Priority Data

Dec. 4, 1991 [JP] Japan .................. 3-320708
Dec. 4, 1991 [JP] Japan .................. 3-320709

[51] Int. Cl.$^5$ ............................................ G11C 11/22
[52] U.S. Cl. .................... 365/145; 257/77; 257/411; 257/751
[58] Field of Search .......... 365/145, 149; 257/77, 257/411, 751

[56] References Cited

U.S. PATENT DOCUMENTS

| | | | |
|---|---|---|---|
| 3,832,700 | 8/1974 | Wu et al. ................. | 365/145 |
| 5,103,285 | 4/1992 | Furumura et al. ........ | 257/751 |
| 5,170,231 | 12/1992 | Fujii et al. ................ | 257/77 |
| 5,231,297 | 7/1993 | Nakayama et al. ....... | 257/77 |

OTHER PUBLICATIONS

Matsui et al., "PbTiO$_3$ Thin Film Gate Nonvolatile Memory FET", 1979, 1979 Proceedings of the 2nd Meeting on Ferroelectric Materials and Their Applications F-8, pp. 239-244.
Higumi et al., "MFS"-A New Type of Nonvolatile Memory Switch Using PLZT Film, Proceedings of the 9th Conference on Solid State Devices, Tokyo, 1977; Japanese Journal of Applied Physics, vol. 17 (1978) Supplement 17-1, pp. 209-214.

Primary Examiner—Eugene R. LaRoche
Assistant Examiner—Christopher R. Glembocki
Attorney, Agent, or Firm—Steven M. Rabin

[57] ABSTRACT

A semiconductor device having a field effect transistor in which a silicon carbide layer and a ferroelectric film are stacked in this order on the surface of a silicon substrate and the ferroelectric film is used as a gate insulation film. A channel between a source and a drain is formed in the silicon carbide layer. A metal or oxygen contained in a ferroelectric material is difficult to diffuse in silicon carbide. Therefore, the silicon carbide layer is not eroded in the case of heat treatment after forming the ferroelectric film. Therefore, good FET characteristics is obtained.

45 Claims, 13 Drawing Sheets

SEMICONDUCTOR DEVICE HAVING FIELD EFFECT TRANSISTOR USING FERROELECTRIC FILM AS GATE INSULATION FILM

BACKGROUND OF THE INVENTION

1. Field of the Invention

The present invention relates to a field effect transistor suitably used in a nonvolatile memory such as an EEPROM (Electrically Erasable/Programmable Read Only Memory) and a method of manufacturing the same, and a semiconductor memory device using the transistor.

2. Description of the Prior Art

If an electric field is applied to a ferroelectric material such as PZT (lead(Pb) Zirconate Titanate), there occurs a state where the direction of polarization is aligned in the direction of the electric field. This state remains after the electric field is removed. That is, polarization in the ferroelectric material displays hysteresis relative to the application of the electric field. Consequently, it is possible to construct a nonvolatile memory device by utilizing such hysteresis.

The memory device using the ferroelectric material is described in, for example, U.S. Pat. No. 3,832,700, a document entitled "PbTiO$_3$ Thin Film Gate Nonvolatile Memory FET", 1979 Proceedings of the 2nd Meeting on Ferroelectric Materials and Their Applications F-8, pp. 239-244, and a document entitled ""MFS FET"—A New Type of Nonvolatile Memory Switch Using PLZT Film", Proceedings of the 9th Conference on Solid State Devices, Tokyo, 1977; Japanese Journal of Applied Physics, Volume 17 (1978) Supplement 17-1, pp. 209-214.

In the memory device described in the documents, a field effect transistor constructed as shown in a simplified diagram of FIG. 13 so as to store information. That is, a ferroelectric film 3 is formed as a gate insulation film on the surface of a P-type silicon substrate 2 on which an N+-type impurity region having a high concentration 1 serving as a source region and a drain region are formed. A gate electrode 4 is formed on the ferroelectric film 1.

For example, when the substrate 2 is brought into a ground potential level and a positive write voltage VP is applied to the gate electrode 4, polarization shown in FIG. 13 (a) is brought about in the ferroelectric film 3. Therefore, electrons which are minority carriers are attracted to the surface of the P-type silicon substrate 2, to form a channel 5. Consequently, a conduction state occurs between the source and the drain. The polarization in the ferroelectric film 3 is held after the write voltage VP is removed. Accordingly, a state where the channel 5 is formed is maintained even after the write voltage VP is removed.

On the other hand, if a negative erase voltage −VE is applied to the gate electrode 4, polarization in the opposite direction to that at the time of application of the write voltage VP is brought about in the ferroelectric film 3, as shown in FIG. 13 (b). Consequently, the channel 5 disappears, so that a non-conduction state occurs between the source and the drain. This state is maintained even after the erase voltage −VE is removed.

Two states such as a writing state and an erasing state can be thus set depending on the presence or absence of the channel 5, thereby to make it possible to store information. The stored information can be read out by examining whether the transistor is conductive or non-conductive.

However, the following problems arise in the above-mentioned construction. That is, in the above-mentioned field effect transistor, the ferroelectric film 3 is formed in contact with the surface of the P-type silicon substrate 2. Therefore, a metal such as Pb in the ferroelectric film 3 is diffused in the silicon substrate 2 at the time of heat treatment in the diffusion process, the thin film formation process and the like for device formation, and the surface of the silicon substrate 2 is oxidized at the time of forming the ferroelectric film 3. Therefore, the characteristics as the field effect transistor are degraded.

DESCRIPTION OF THE RELATED ART

In order to solve the above-mentioned problems, the technique for first forming a silicon oxide film on the surface of a silicon substrate and depositing a ferroelectric film on the silicon oxide film has been proposed. In the proposed technique, a circuit shown in FIG. 12 is equivalently constructed in the vicinity of a gate. That is, the vicinity of the gate is equivalent to a state where a capacitance C1 corresponding to the ferroelectric film and a capacitance C2 corresponding to the silicon oxide film are connected in series between a gate electrode and a channel region in the silicon substrate.

Since the dielectric constant of the ferroelectric film is approximately 100 to 1000 times that of the silicon oxide film, however, the capacitance C1 is significantly larger than the capacitance C2. Consequently, a large part of a voltage applied to the gate electrode is applied to the silicon oxide film corresponding to the capacitance C2. Therefore, an attempt to apply a voltage for bringing about desired polarization in the ferroelectric film causes the necessity of applying a significantly high voltage to the region between the gate electrode and the silicon substrate. Consequently, it is difficult to apply the above-mentioned construction to an actual device.

Meanwhile, a metal or oxygen is difficult to diffuse in a silicon carbide crystal. Therefore, it is considered that the ferroelectric film is formed on the surface of a silicon carbide substrate to construct a memory device. In the silicon carbide substrate, however, not only the metal or the oxygen but also impurities are difficult to diffuse. Therefore, it is difficult to control the conductivity type by the diffusion of impurities. That is, if the silicon carbide substrate is used, it is difficult to form an impurity region having a high concentration serving as a source and a drain.

Because of the great difficulty in applying a ferroelectric film to a memory device, a memory device using a ferroelectric film has not been put to practical use yet in the present circumstances.

SUMMARY OF THE INVENTION

Therefore, an object of the present invention is to provide a semiconductor device having a good field effect transistor having a ferroelectric film.

Another object of the present invention is to provide a semiconductor device which can be put to practical use using a field effect transistor having a ferroelectric film.

Still another object of the present invention is to provide a method of manufacturing the above-mentioned semiconductor device.

A semiconductor device according to the present invention so as to achieve the above-mentioned objects comprises a semiconductor substrate having high concentration impurity regions of a predetermined conductivity type serving as a source region and a drain region formed with spacing thereon, a silicon carbide layer of a conductivity type opposite to that of the above-mentioned high concentration impurity regions formed on the surface of the above-mentioned semiconductor substrate so as to connect the high concentration impurity regions, a ferroelectric film stacked on the silicon carbide layer, and a gate electrode formed on the ferroelectric film.

In order to manufacture such a field effect transistor, on the surface of a semiconductor substrate where high concentration impurity regions of a predetermined conductivity type serving as a source region and a drain region is to be formed, a silicon carbide layer of a conductivity type opposite to that of the above-mentioned high concentration impurity regions is formed so as to connect regions where the high concentration impurity regions are to be formed. The above-mentioned high concentration impurity regions are then formed, and a ferroelectric film is further formed on the above-mentioned silicon carbide layer. A gate electrode is formed on the ferroelectric film. In addition, a source electrode and a drain electrode are formed so as to be electrically connected to the high concentration impurity regions. Therefore, the field effect transistor of the above-mentioned construction is obtained.

In the above-mentioned construction, the ferroelectric film is formed on the silicon carbide layer formed on the semiconductor substrate. Consequently, a metal or oxygen in the ferroelectric film is not diffused in the silicon carbide layer. Therefore, a region in the vicinity of the surface of the silicon carbide layer is used as a channel region, thereby to make it possible to obtain good FET characteristics.

Moreover, if a silicon substrate capable of easily controlling the conductivity type by the diffusion of impurities, for example, is applied to the semiconductor substrate, it is possible to easily form the high concentration impurity regions serving as a source region and a drain region. Consequently, it is not difficult to manufacture the device.

The silicon carbide layer constitutes the channel region. However, a high impurity concentration is not required in the channel region. Accordingly, it is not difficult to control the conductivity type of the silicon carbide layer.

In the field effect transistor of the above-mentioned construction, a threshold value for causing the channel to be formed on the surface of the silicon carbide layer can be set to two types of values depending on the direction of polarization in the ferroelectric film. Therefore, a field effect transistor having two types of threshold values is achieved. In other words, a field effect transistor having two stable states is achieved.

In such a manner, a field effect transistor using a ferroelectric film as a gate insulation film, which is easily put to practical use, is achieved. As a result, a nonvolatile memory device utilizing hysteresis of polarization in a ferroelectric substance relative to an electric field will be put to practical use by using the above-mentioned field effect transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
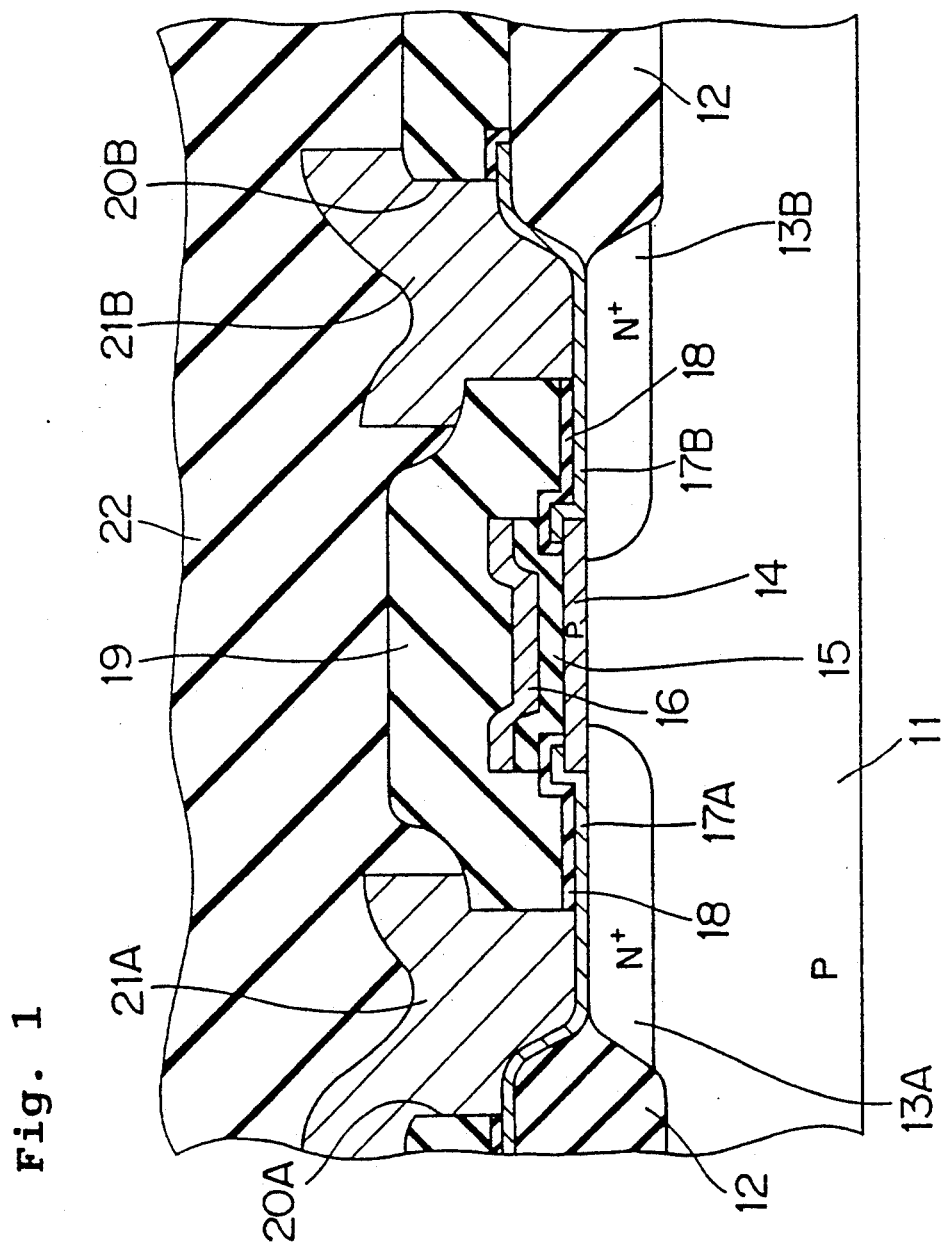
FIG. 1 is a cross sectional view showing a part of a nonvolatile memory device according to an embodiment of the present invention.

FIG. 1 is a cross sectional view showing a part of a nonvolatile memory device according to one embodiment of the present invention, which illustrates the construction of a field effect transistor used as a memory transistor. A device forming region separated by a field oxide film 12 is formed on a P-type silicon substrate 11. Impurity regions having a high concentration 13A and 13B serving as a source region and a drain region (generically named "an impurity region having a high concentration 13") are formed with predetermined spacing in the device forming region. A P-type silicon carbide layer 14 is formed on the surface of the substrate 11 so as to connect the high concentration impurity regions 13A and 13B. A ferroelectric film 15 composed of PZT or the like and a gate electrode 16 composed of polysilicon are stacked in this order on the silicon carbide layer 14.

N+-type polysilicon films 17A and 17B (generically named "a polysilicon film 17") are formed in a region covering the surface of the impurity region having a high concentration 13 and ends of the silicon carbide layer 14. In addition, a silicon oxide film 18 is formed between the polysilicon film 17 and the ferroelectric film 15 so as to prevent the contact.

A silicon oxide film 19 is formed so as to cover the gate electrode 16 and the like. Contact holes 20A and 20B are formed in positions, which correspond to portions above the high concentration impurity regions 13A and 13B, of the silicon oxide film 19 and the above mentioned silicon oxide film 18. Metals 21A and 21B serving as a source electrode and a drain electrode are deposited in the contact holes 20A and 20B. The metals 21A and 21B are respectively connected to the N+-type high concentration impurity regions 13A and 13B through the N+-type polysilicon films 17A and 17B. Consequently, a good ohmic contact is formed. Reference numeral 22 denotes a passivation film.

Figure 2:
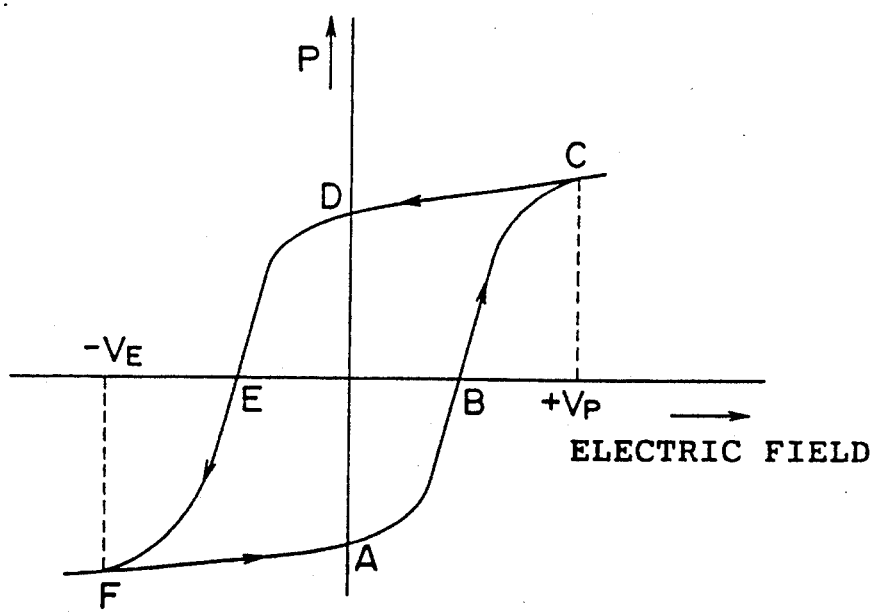
FIG. 2 is a diagram showing hysteresis of polarization in a ferroelectric substance relative to an electric field.

FIG. 2 is a diagram showing the change in polarization in a case where an electric field is applied to a ferroelectric film. As the electric filed applied to the ferroelectric film is increased, polarization P in the direction of the electric field is increased, so that the ferroelectric film enters a saturated state C. As the electric field is then decreased, the polarization P is decreased. The polarization P remains even if the electric field is made zero, so that the ferroelectric film enters a state D. In addition, as an electric field in the opposite direction is applied, the polarization P is decreased. The polarization P becomes zero in a state E where a given negative electric field is applied. Furthermore, as the electric field in the opposite direction is increased, the polarization P is increased in the opposite direction, so that the ferroelectric film enters a saturated state F. In this state, as the negative electric field is decreased, the polarization P remains even if the electric field is made zero, so that the ferroelectric film enters a state A. In this state, as the positive electric field is increased, the ferroelectric film enters the above-mentioned saturated state C through the state B.

The polarization P in the ferroelectric film 2 thus displays hysteresis relative to the electric field. In the memory device according to the present embodiment, a storing operation is achieved utilizing the hysteresis.

FIG. 3 is a diagram showing the concept of the principled construction of the transistor shown in FIG. 1. The following table 1 collectively shows operations at the time of writing, erasing and reading out information. Description is now made on the operations of the transistor with reference to FIG. 3 and Table 1.

TABLE 1

| operation | gate | ferroelectric film gate side | substrate side | state | SiC Surface | state of transistor |
|---|---|---|---|---|---|---|
| write | $+V_P$ | − | + | C | − | on |
| erase | $-V_E$ | + | − | F | + | off |
| read | 0 | no change | no change | A or D | no change | on/off |

Writing Operation

If a P-type semiconductor substrate 11 is brought into a ground potential level and a positive write voltage $V_p$ is applied to a gate electrode 16 from a gate voltage applying circuit 26, a state shown in FIG. 3 (a) occurs. That is, such polarization P as to be minus on the side of the gate electrode 16, while being plus on the side of the substrate 11 is brought about in a ferroelectric film 15, so that the ferroelectric film 15 enters the state C shown in FIG. 2. At this time, electrons which are minority carriers are induced in the surface, which is in contact with the ferroelectric film 15, of a silicon carbide (SiC) layer 14. As a result, a channel connecting a source region (an N+-type impurity region having a high concentration 17A) and a drain region (an N+-type impurity region having a high concentration 17B) is formed. That is, the field effect transistor is rendered conductive (is turned on) in this case. After the application of the write voltage $V_p$ is stopped, the ferroelectric film 15 enters the state D shown in FIG. 2, so that the polarization P remains. Consequently, a state where the channel is formed is maintained.

Erasing Operation

If a negative erase voltage $-V_E$ (for example, $V_E=V_P$) is applied to the gate electrode 16 from the gate voltage applying circuit 26, a state shown in FIG. 3 (b) occurs. That is, such polarization P as to be plus on the side of the gate electrode 16, while being minus on the side of the substrate 11 is brought about in the ferroelectric film 15, so that the ferroelectric film 15 enters the state F shown in FIG. 2. At this time, holes are induced in the surface of the silicon carbide layer 14. Accordingly, the channel disappears, so that a non-conduction state occurs between the source and the drain. After the erase voltage $-V_E$ is removed, the ferroelectric film 15 enters the state A shown in FIG. 2, so that the polarization P equal in direction to that in the state F remains. Consequently, even if the application of the erase voltage $-V_E$ is stopped, a state where the channel disappears is maintained.

Reading operation

Figure 3A:
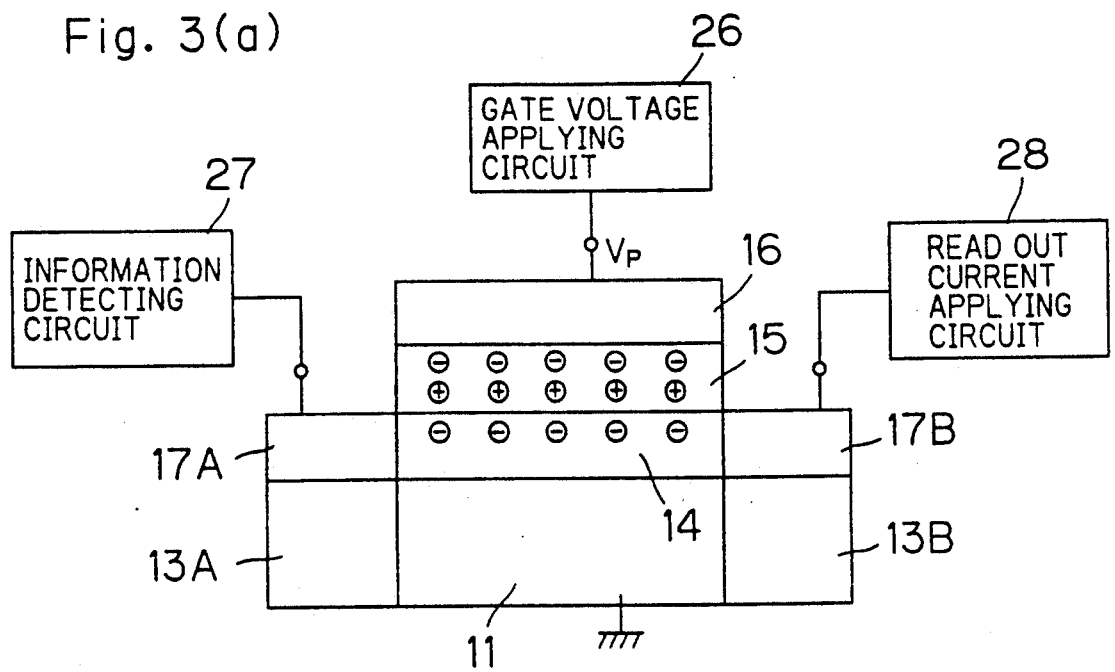
FIGS. 3 (a) and 3 (b) are diagrams showing the concept of the principled construction of a memory transistor in the above-mentioned nonvolatile memory device.
Figure 3B:
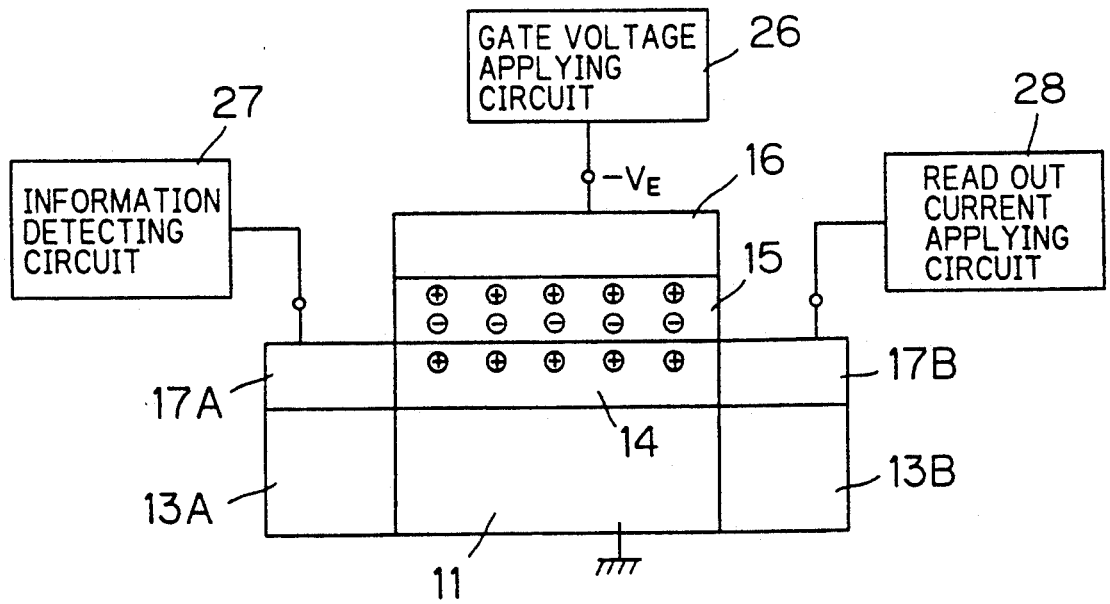
Figure 4A:
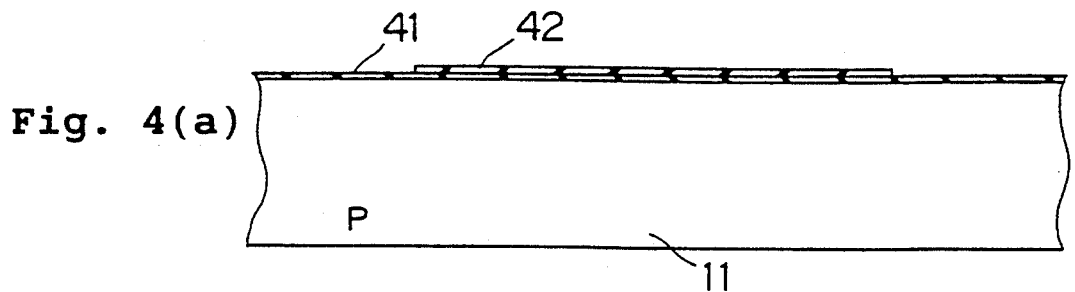
FIGS. 4 (a) to 4 (d) are cross sectional views showing the sequential steps of a method of manufacturing the above-mentioned nonvolatile memory device.
Figure 4B:
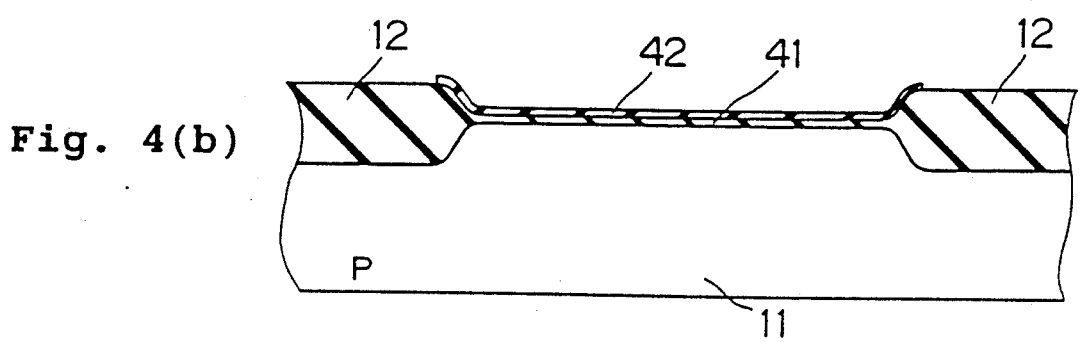
Figure 4C:
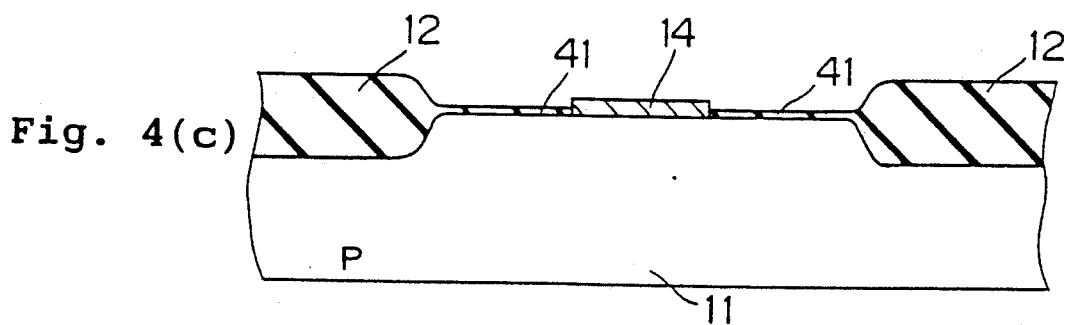
Figure 4D:
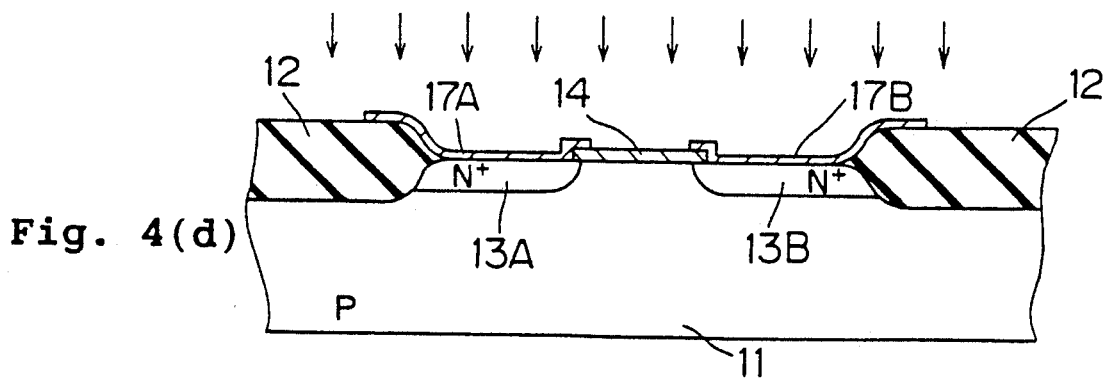

At the time of reading out stored information, the gate voltage applying circuit 26 applies to the gate electrode 16 such a predetermined sense voltage that a conductive state occurs in the state of FIG. 3(a) and a non-conductive state occurs in the state of FIG. 3(b) between the source and the drain. Accordingly, the transistor is rendered conductive in a writing state, while being rendered non-conductive in an erasing state. Consequently, a current is applied to, for example, the drain from a read out current applying circuit 28 to examine whether or not the current is detected by an information detecting circuit 27 connected on the side of the source, thereby to make it possible to read out the information.

As described in the foregoing, in the field effect transistor constituting the memory device according to the prevent embodiment, the ferroelectric film 15 is stacked on the silicon carbide layer 14 formed on the surface of the silicon substrate 11 so as to connect the high concentration impurity regions 13A and 13B, and the channel is formed on the surface of the silicon carbide layer 14. The rate of diffusion of a metal or oxygen included in a ferroelectric substance in silicon carbide is much lower, that is, 1/10 to 1/1000, as compared with that in silicon. Even at the time of heat treatment in the device formation process, therefore, the metal or the oxygen in the ferroelectric film 15 is not diffused in the silicon carbide layer 14. Consequently, in the above-mentioned field effect transistor so adapted that the silicon carbide layer 14 constitutes the channel, good FET characteristics can be achieved.

On the other hand, the lattice constant of silicon is 5.43 Å, while the lattice constant of silicon carbide is 4.36 Å. The lattice constant of silicon carbide is very similar to the lattice constant of PZT (4.08 to 4.12 Å). Consequently, if the ferroelectric film 15 is composed of PZT, hysteresis and reversing characteristic of polarization in the ferroelectric film becomes significantly good, thereby to make it possible to achieve a good storing operation. That is, the polarization in the ferroelectric film 15 can be reversed at low voltage and low power.

Furthermore, in the present embodiment, the impurity region having a high concentration 13 serving as a source region and a drain region is formed in the silicon substrate 11. That is, the impurity region having a high concentration 13 is formed in a silicon crystal in which impurities are easily diffused because it is difficult to control the conductivity type by the diffusion of impurities in a silicon carbide crystal.

In such a manner, the channel is constituted by the silicon carbide layer 14 to realize good FET characteristics, and the impurity region having a high concentration 13 is formed in the silicon substrate 11 to make it easy to produce the device. It is necessary to control the conductivity type of the silicon carbide layer 14 constituting the channel region to be a P-conductivity type. Since a low impurity concentration is sufficient in the channel region, however, it is not difficult to control the conductivity type of the silicon carbide layer 14.

Figure 5E:
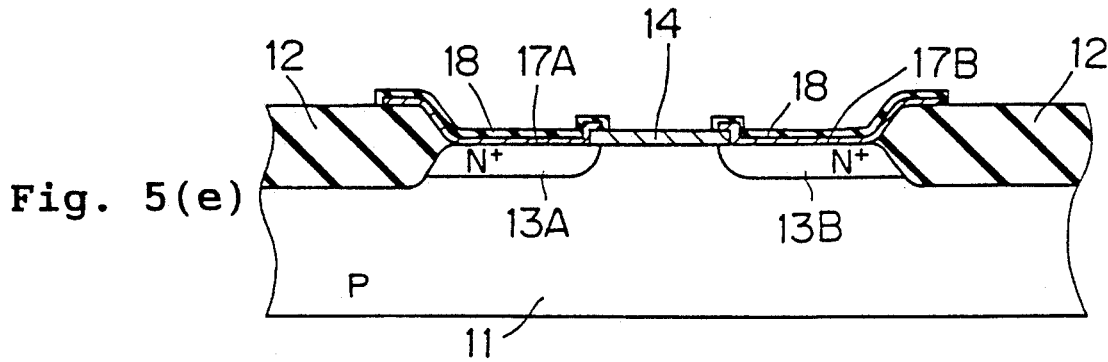
FIGS. 5 (e) to 5 (g) are cross sectional views showing the sequential steps subsequent to the step shown in FIG. 4 (d)
Figure 5F:
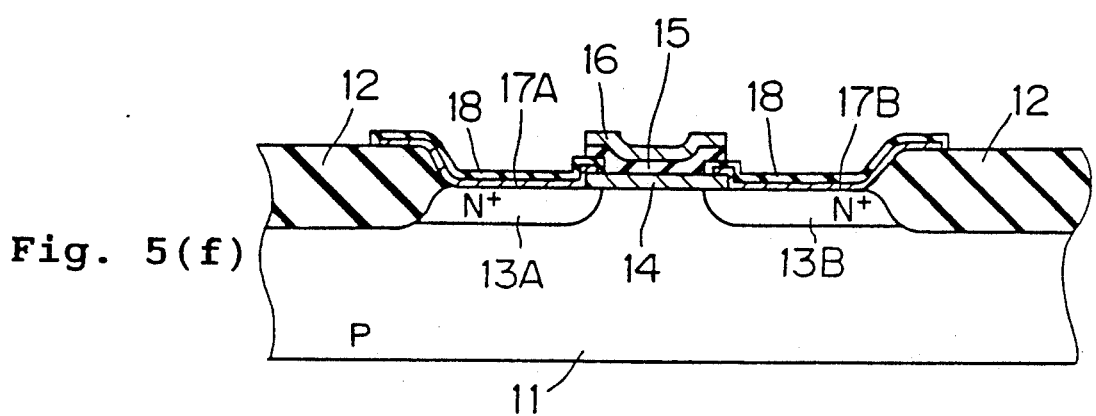
Figure 5G:
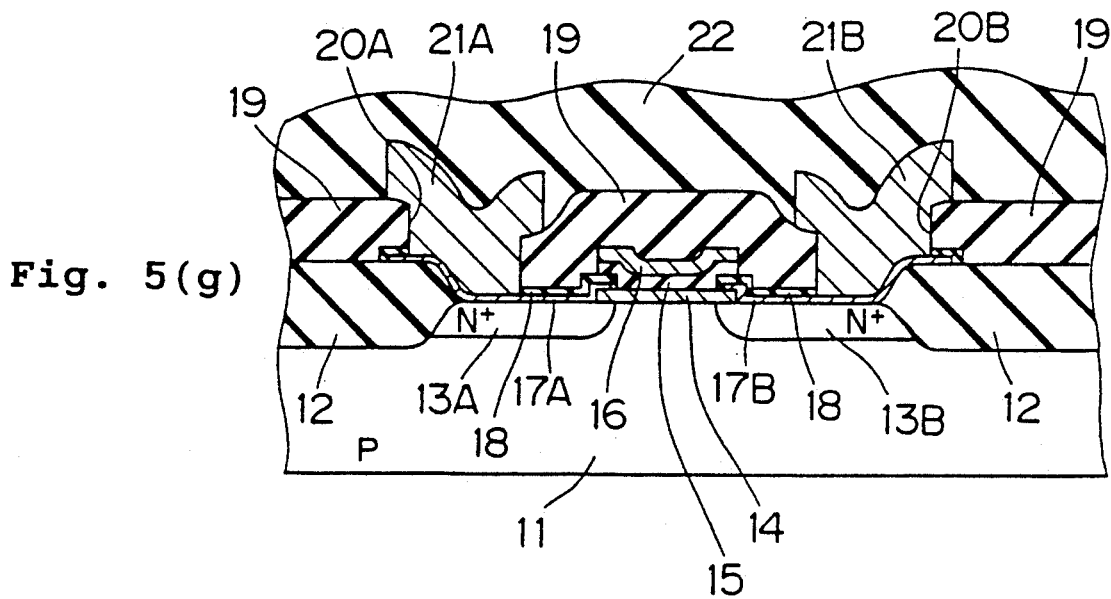

FIGS. 4 and 5 are cross sectional views showing the sequential steps of a method of manufacturing the above-mentioned nonvolatile memory device. As shown in FIG. 4 (a), a silicon oxide film as a pad oxide 41 (for example, 500 Å) is first formed on the surface of a P-type silicon substrate 11 by the thermal oxidation process. A silicon nitride film ($Si_3N_4$) 42 is patterned on the surface of the silicon oxide film 41. This silicon nitride film 42 is formed by, for example, the low-pressure CVD process, and the thickness thereof is, for example, 1500 Å. The ordinary photolithographic technique and photoetching technique are applied to patterning after film formation.

As shown in FIG. 4 (b), a field oxide film for device isolation 12 is then selectively formed by the thermal oxidation process utilizing the silicon nitride film 42 as a mask.

As shown in FIG. 4 (c), the silicon nitride film 42 is then stripped, and the silicon oxide film 41 in a channel region is selectively removed by the photolithographic technique. Furthermore, silicon carbide is selectively grown on the surface of the substrate 11 exposed from the formed hole by removing the silicon oxide film 41, to form a silicon carbide layer 14. The thickness of the silicon carbide layer 14 is, for example, 10 nm. Since silicon carbide is not easily grown on a silicon oxide film, the selective growth of a silicon carbide layer 14 in contact with the substrate 11 can be easily achieved.

In this state, the silicon oxide film 41 in a source region and a drain region is removed. A polysilicon film having a thickness of, for example, 100 nm is then formed by the low-pressure CVD process. Thereafter, phosphorous ions are implanted into the substrate 11. The phosphorous ions are implanted passing through the polysilicon films. After the phosphorous ions are implanted, the thermal diffusion processing of impurities is performed by annealing. Consequently, $N^+$-type high concentration impurity regions 13A and 13B are formed in the substrate 11, and the above-mentioned polysilicon film is of an $N^+$-type to be a low-resistance. The polysilicon film is patterned, thereby to obtain $N^+$-type polysilicon films 17A and 17B, as shown in FIG. 4 (d).

In this state, the surface of the polysilicon film 17 is thermally oxidized. Consequently, a silicon oxide film 18 having a thickness of 50 nm is formed, so that a state shown in FIG. 5 (e) occurs.

A ferroelectric film 15 composed of, for example, PZT is then formed. In addition, a polysilicon film 16 serving as a gate electrode is formed on the ferroelectric film 15. The films 15 and 16 are patterned by the photolithographic technique, so that a state shown in FIG. 5 (f) occurs. The ferroelectric film 15 can be formed by, for example, the sputtering process, the CVD process, and the SOL-GEL process. The thickness of the ferroelectric film 15 is, for example, 500 nm. In addition, the polysilicon film 16 is formed by, for example, the low-pressure CVD process, and the thickness thereof is, for example, 500 nm.

In the state shown in FIG. 5 (f), a silicon oxide film (BPSG) 19 is then formed on the whole surface, and reflow processing is further performed so as to improve the step coverage. Contact holes 20A and 20B are formed in positions, which correspond to portions above the high concentration impurity regions 13A and 13B, of silicon oxide films 18 and 19. Metals 21A and 21B electrically connected to the high concentration impurity regions 13A and 13B through the polysilicon films 17A and 17B are respectively formed in the contact holes 20A and 20B. The metals 21A and 21B will respectively serve as a source electrode and a drain electrode. The metals 21A and 21B are composed of, for example, aluminum. After the metals 21A and 21B are formed, a passivation film 22 is formed so as to cover the whole surface. A device shown in FIG. 5 (g) is thus completed.

Figure 6:
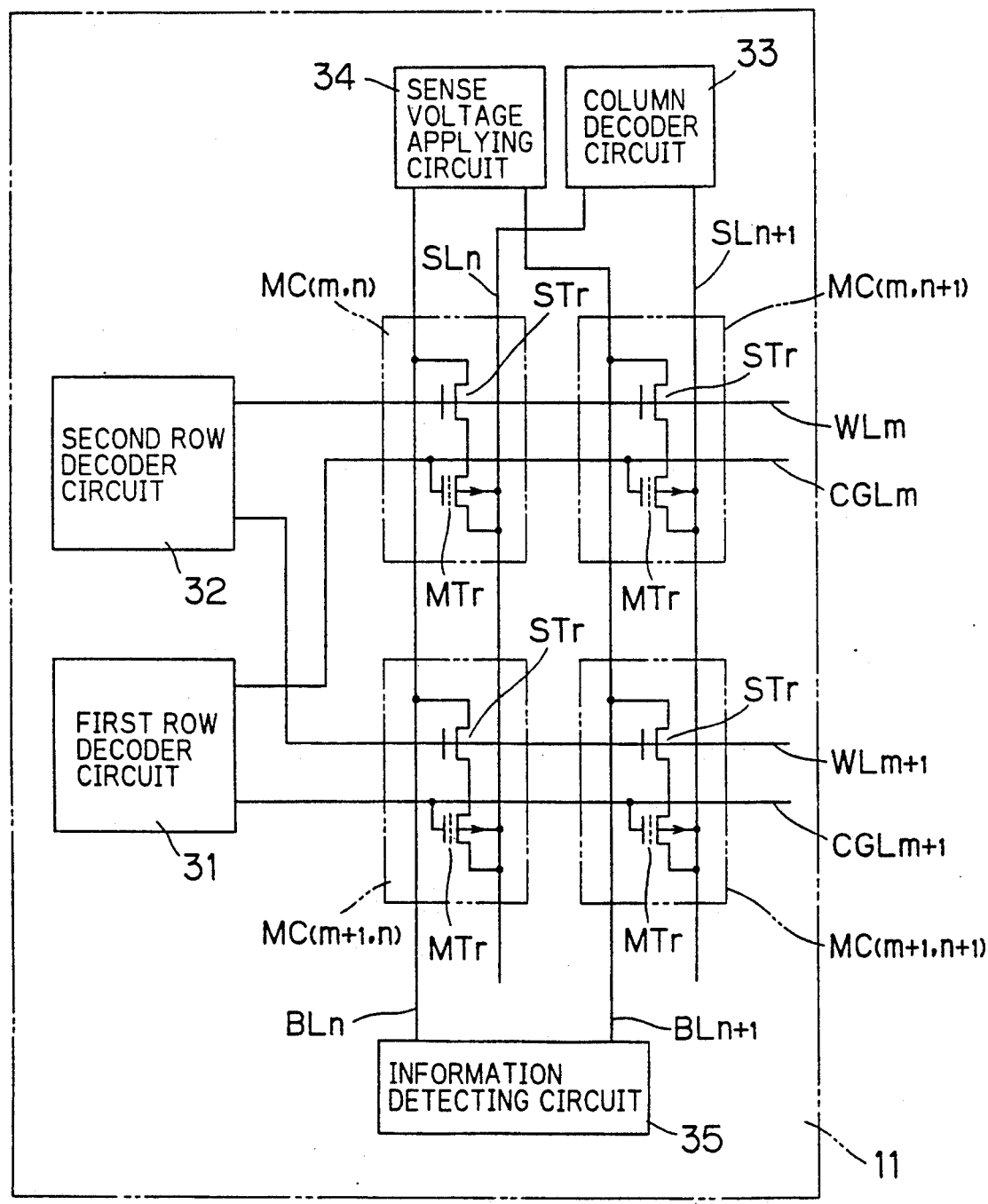
FIG. 6 is a electric circuit diagram showing the circuit arrangement of the above-mentioned nonvolatile memory device in which memory cells are arranged in a matrix manner.

FIG. 6 is an electric circuit diagram showing the circuit arrangement of a nonvolatile memory device so constructed that a plurality of memory cells each having the above-mentioned field effect transistor are arranged on the silicon substrate 11 in a matrix manner. Four memory cells are shown in FIG. 6, however, one million memory cells or so, for example, are actually arranged on the substrate 11 in a matrix manner. Each of the memory cells comprises the above-mentioned field effect transistor as a memory transistor MTr, and a selecting transistor STr for selecting the cell. In memory cells MC (m, n) and MC (m, n+1) aligned in one direction, gates of the respective selecting transistors STr are connected together to a word line $WL_m$. Similarly, in memory cells MC (m+1, n) and MC (m+1, n+1) aligned in the above-mentioned one direction, gates of the respective selecting transistors STr are connected together to a word line $WL_{m+1}$. In addition, gates of the respective memory transistors MTr in the memory cells MC (m, n) and MC (m, n+1) are connected together to a control gate line $CGL_m$. In addition, gates of the respective memory transistors MTr in the memory cells MC (m+1, n) and MC (m+1, n +1) are connected together to a control gate line $CGL_{m+1}$.

On the other hand, in the memory cells MC (m, n) and MC (m+1, n) aligned in a direction intersecting the word lines $WL_m$ and $WL_{m+1}$, drains of the respective selecting transistors STr are connected together to a bit line $BL_n$. Similarly, in the memory cells MC (m, n+1) and MC (m+1, n+1) aligned in the direction intersecting the word lines $WL_m$ and $WL_{m+1}$, drains of the respective selecting transistors STr are connected together to a bit line $BL_{n+1}$. In addition, sources and substrates of the respective memory transistors MTr in the memory cells MC (m, n) and MC (m+1, n) are connected together to a source line $SL_n$. Similarly, sources and substrates of the respective memory transistors MTr in the memory cells MC (m, n+1) and MC (m+1, n+1) are connected together to a source line $SL_{n+1}$.

A voltage from a first row decoder circuit 31 is applied to the control gate lines $CGL_m$ and $CGL_{m+1}$. Similarly, a control voltage from a second row decoder circuit 32 is applied to the word lines $WL_m$ and $WL_{m+1}$. In addition, a voltage from a column decoder circuit 33 is applied to the source lines $SL_n$ and $SL_{n+1}$, and a voltage from a sense voltage applying circuit 34 is applied to the bit lines $BL_n$ and $BL_{n+1}$. The bit lines $BL_n$ and $BL_{n+1}$ are connected to an information detecting circuit 35.

The following table 2 collectively show voltages respectively applied to the bit lines $BL_n$ and $BL_{n+1}$, the source lines $SL_n$ and $SL_{n+1}$, the word lines $WL_m$ and $WL_{m+1}$, and the control gate lines $CGL_m$ and $CGL_{m+1}$ in cases where the memory cell MC (m, n) is selected and information is written, erased and read out with respect to the memory cell M(m, n). Referring now to Table 2 and FIG. 6, description is made on operations of writing, erasing and reading out information with respect to the memory cell MC (m, n). In the table 2, a sign "—" indicates that the signal line is opened or an arbitrary voltage is applied thereto.

The above-mentioned write voltage $V_p$ is set to a value at which the following expression holds with respect to a coesive electric field which is the lowest voltage (voltages at points B and E shown in FIG. 2) at which the direction of polarization in the ferroelectric film 15 can be reversed.

$$\frac{V_P}{2} < \text{(coesive electric field)} < V_P$$

At the time of this writing operation, in the memory cell MC (m, n+1) sharing the control gate line $CGL_m$ with the memory cell MC (m, n), the source line $SL_{n+1}$ is brought into a ground potential level. Therefore, in the memory transistor MTr in the cell MC (m, n+1), a voltage $\frac{1}{2} \cdot V_p$ which is one-half of the write voltage $V_p$ is only applied to the ferroelectric film 15. Accordingly, the arrangement of the polarization is not changed, so that information is not written to the memory transistor MTr. Similarly, in the memory cell MC (m+1, n) sharing the source line $SL_n$ with the memory cell MC (m, n), the control gate line $CGL_{m+1}$ is brought into a ground potential level, so that information is not written. In the memory cell MC (m+1, n+1), both the control gate line $CGL_{m+1}$ and the source line $SL_{n+1}$ are brought into a ground potential level, so that information is not written.

The erasing operation is achieved in the same manner as the writing operation. That is, the erasing operation is an operation for aligning the direction of polarization in the ferroelectric film 15 in the memory transistor MTr

[TABLE 2]

| operation | BL n | BL n+1 | SL n | SL n+1 | WL m | WL m+1 | CGL m | CGL m+1 |
|---|---|---|---|---|---|---|---|---|
| write | — | — | $-\frac{V_P}{2}$ | 0 | $-\frac{V_P}{2}$ | $-\frac{V_P}{2}$ | $+\frac{V_P}{2}$ | 0 |
| erase | — | — | $+\frac{V_P}{2}$ | 0 | 0 | 0 | $-\frac{V_P}{2}$ | 0 |
| read | S | S | 0 | 0 | 5 V | 0 | 0 | 0 |

When information is written, the second row decoder circuit 32 applies $-\frac{1}{2} \cdot V_p$ to the word lines $WL_m$ and $WL_{m+1}$. In addition, the column decoder circuit 33 applies $-\frac{1}{2} \cdot V_p$ to the source line $SL_n$. Furthermore, the first row decoder circuit 31 applies $+\frac{1}{2} \cdot V_p$ to the control gate line $CGL_m$. Therefore, in the memory cell MC (m, n), a write voltage $V_p$ which is plus on the side of the gate 16 is applied to the region between the semiconductor substrate 11 and the gate 16. Consequently, the direction of polarization in the ferroelectric film 15 is aligned in the direction from the gate 16 to the substrate 11, to achieve writing of information. That is, in this state, electrons which are minority carriers are induced to the surface of the P-type silicon carbide layer 14 directly under the ferroelectric film 15, so that a channel is formed. As a result, the threshold value of the memory transistor MTr becomes low. In the present embodiment, even in a state where the control gate line $CGL_m$ is brought into a ground potential level, the memory transistor MTr is rendered conductive.

A gate of the selecting transistor STr in the memory cell MC (m, n) is applied the potential equal to that of the semiconductor substrate 11 from the word line WLm. Therefore, a conductive state does not occur in the selecting transistor STr.

in the selected memory cell MC (m, n) in the direction opposite to that in a writing state. Consequently, a voltage which is opposite in polarity to that at the time of writing is applied to the control gate line $CGL_m$ and the source line $SL_n$, to achieve the erasing operation. In an erasing state, the threshold value of the memory transistor MTr in the memory cell MC (m, n) becomes high. When the control gate line $CGL_m$ is brought into a ground potential level, the memory transistor MTr is rendered non-conductive.

At the time of reading out information, any of the source lines $SL_n$ and $SL_{n+1}$ and the control gate lines $CGL_m$ and $CGL_{m+1}$ are brought into a ground potential level. Consequently, the memory transistor MTr in the memory cell in a writing state is rendered conductive, while the memory transistor MTr in the memory cell in an erasing state is rendered non-conductive. In this state, a voltage (for example, 5 volts) which allows the selecting transistor STr to be rendered conductive is applied to the word line $WL_m$ corresponding to the memory cells MC (m, n) and MC (m, n+1) from the second row decoder circuit 32. In addition, a predetermined sense voltage S is applied to the bit lines $BL_n$ and $BL_{n+1}$ from the sense voltage applying circuit 34. At this time, the information detecting circuit 35 watches whether or not potentials on the bit lines $BL_n$ and $BL_{n+1}$ drop.

More specifically, if the memory cell MC (m, n) is in a writing state, the memory transistor MTr in the memory cell MC (m, n) is conductive. Therefore, the potential on the bit line $BL_n$ drops to a ground potential which is a potential on the source line $SL_n$. On the other hand, if the memory cell MC (m, n) is in an erasing state, the memory transistor MTr in the memory cell MC (m, n) is non-conductive. Therefore, the above-mentioned potential drop is not produced. Consequently, it is possible to read out information stored in the memory cell MC (m, n) by watching the drop in the potential on the bit line $BL_n$.

The same is true for the memory cell MC (m, n+1) sharing the word line $WL_m$ with the memory cell MC (m, n). That is, the potentials on the bit lines $BL_n$ and $BL_{n+1}$ are individually watched in the information detecting circuit 35, and the sense voltage S is simultaneously applied to the respective bit lines $BL_n$ and $BL_{n+1}$ from the sense voltage applying circuit 34. Consequently, information from a plurality of memory cells connected to the word line $WL_m$ can be read out in parallel.

In the memory cell MC (m+1, n) sharing the bit line $BL_n$ with the memory cell MC (m, n), the word line WL is brought into a ground potential level. Therefore, information is not read out.

In the above described manner, an arbitrary memory cell is selected from the plurality of memory cells arranged in a matrix manner, thereby to make it possible to write, erase and read out information. A large capacity and electrically writable nonvolatile memory utilizing hysteresis of a ferroelectric material relative to an electric field is realized.

Figure 7:
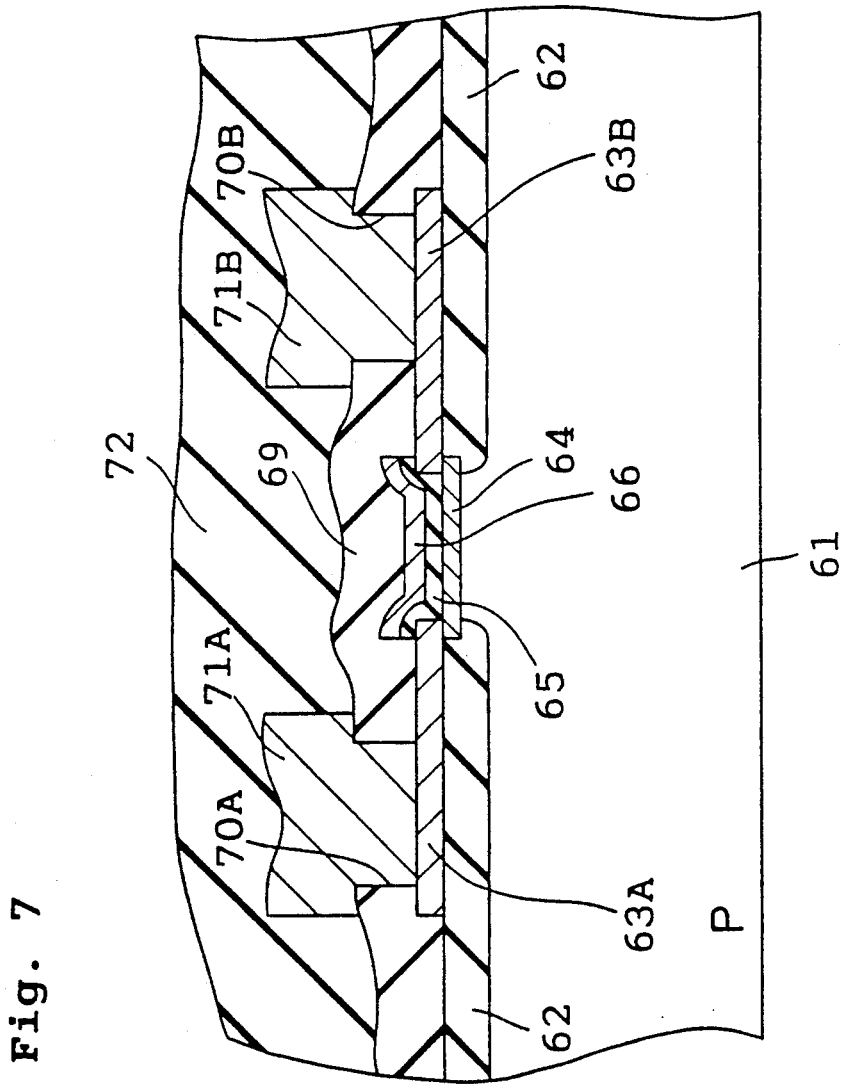
FIG. 7 is a cross sectional view showing a part of a nonvolatile memory device according to another embodiment of the present invention.

FIG. 7 is a cross sectional view showing a part of a nonvolatile memory device according to another embodiment of the present invention, which illustrates the construction of a thin film field effect transistor used as a memory transistor. A P-type silicon carbide layer 64 is formed on the surface of a P-type silicon substrate 61. Silicon oxide films 62 are formed in regions on both sides of the silicon carbide layer 64. A pair of $N^+$-type polysilicon films 63A and 63B (generically named as "a polysilicon film 63") is formed on the silicon oxide films 62 so as to be connected to the abovementioned silicon carbide layer 64 in different positions. The $N^+$-type polysilicon films 63A and 63B serve as a source and a drain. A ferroelectric film 65 composed of PZT or the like and a gate electrode 66 composed of polysilicon are stacked in this order on the silicon carbide layer 64.

A silicon oxide film 69 is formed so as to cover the gate electrode 66 and the like. Contact holes 70A and 70B are formed in positions, which correspond to portions above the polysilicon films 63A and 63B, of the silicon oxide film 69. Metals 71A and 71B serving as a source electrode and a drain electrode are respectively deposited in the contact holes 70A and 70B. Reference numeral 72 denotes a passivation film.

Figure 8A:
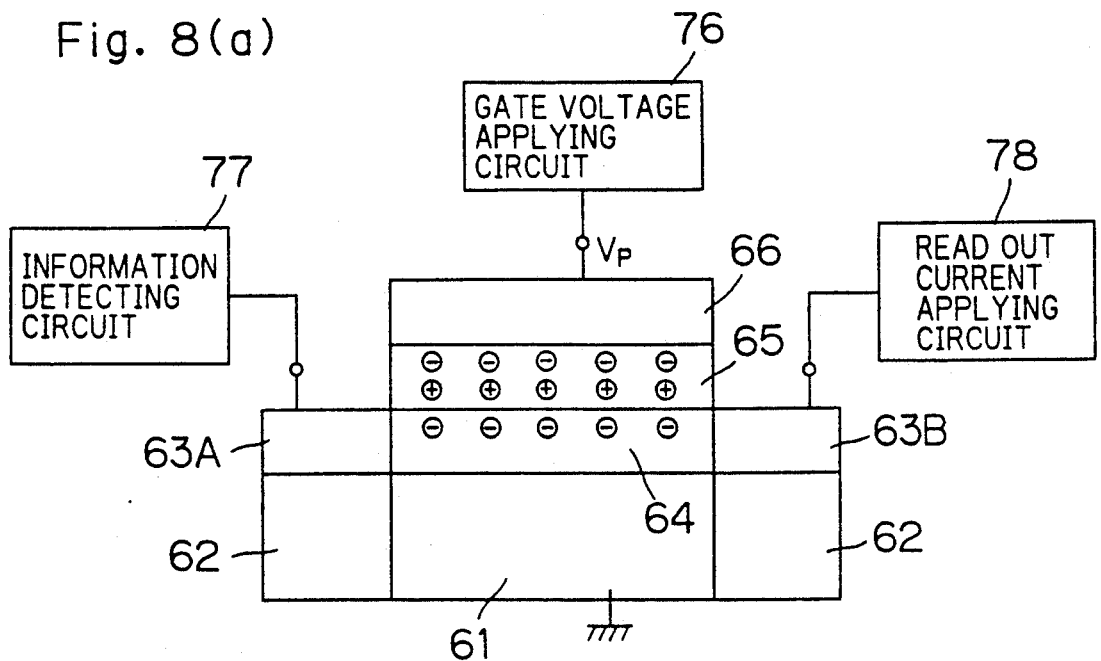
FIGS. 8 (a) and 8 (b) are diagrams showing the concept of the principled construction of a memory transistor in the above-mentioned nonvolatile memory device.
Figure 8B:
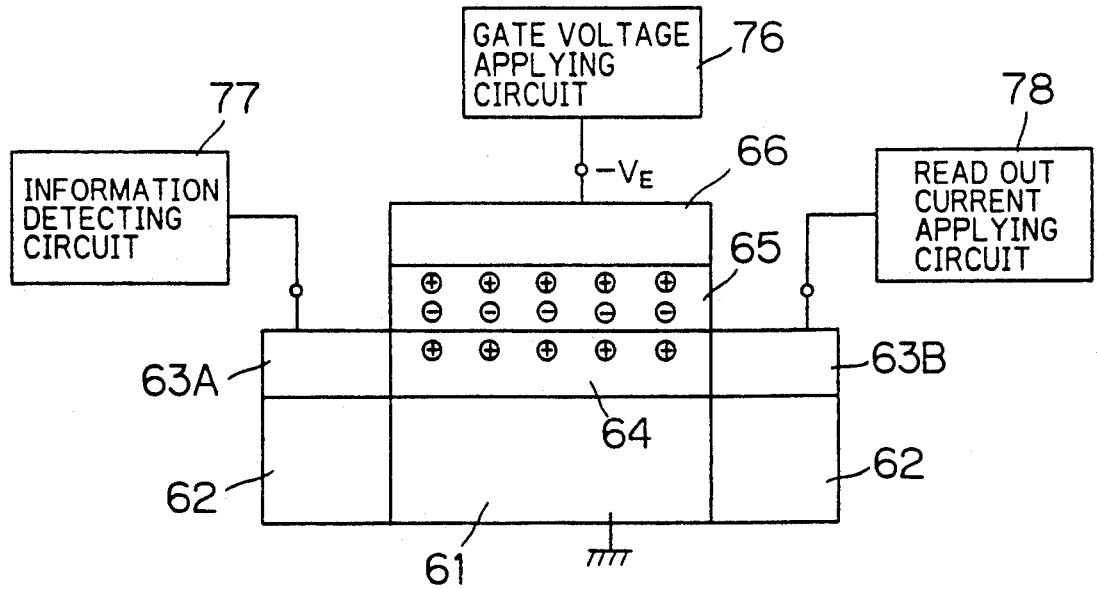

FIG. 8 is a diagram showing the concept of the principled construction of the transistor shown in FIG. 7. The following table 3 collectively shows operations at the time of writing, erasing and reading out information. Description is now made on the operations of the transistor with reference to FIG. 8, Table 3 as well as above-mentioned FIG. 2 showing the nature of the ferroelectric substance.

TABLE 3

| operation | gate | ferroelectric film gate side | ferroelectric film substrate side | state | SiC Surface | state of transistor |
|---|---|---|---|---|---|---|
| write | $+V_P$ | − | + | C | − | on |
| erase | $-V_E$ | + | − | F | + | off |
| read | 0 | no change | no change | A or D | no change | on/off |

Writing Operation

If a P-type semiconductor substrate 61 is brought into a ground potential level and a positive write voltage $V_p$ is applied from a gate voltage applying circuit 76 to a gate electrode 66, a state shown in FIG. 8 (a) occurs. That is, such polarization P as to be minus on the side of the gate electrode 66, while being plus on the side of the substrate 61 is brought about in a ferroelectric film 65, so that the ferroelectric film 65 enters the state C shown in FIG. 2. At this time, electrons which are minority carriers are induced in the surface, which is in contact with the ferroelectric film 65, of a silicon carbide (SiC) layer 64. As a result, a channel connecting a source region (a polysilicon film 63A) and a drain region (a polysilicon film 63B) is formed. That is, the field effect transistor is rendered conductive (is turned on) in this case. After the write voltage $V_p$ is removed, the ferroelectric film 65 enters the state D shown in FIG. 2, so that the polarization P remains. Consequently, a state where the channel is formed is maintained.

Erasing Operation

If a negative erase voltage $-V_E$ (for example, $V_E = V_p$) is applied from the gate voltage applying circuit 76 to the gate electrode 66, a state shown in FIG. 8 (b) occurs. That is, such polarization P as to be plus on the side of the gate electrode 66, while being minus on the side of the substrate 61 is brought about in the ferroelectric film 65, so that the ferroelectric film 65 enters the state F shown in FIG. 2. At this time, holes are induced in the surface of the silicon carbide layer 64. Accordingly, the channel disappears, so that a non-conduction state occurs between the source and the drain. After the erase voltage $-V_E$ is removed, the ferroelectric film 65 enters the state A shown in FIG. 2, so that the polarization P equal in direction to that in the state F remains. Consequently, a state where the channel disappears is maintained.

Reading Operation

At the time of reading out stored information, the gate voltage applying circuit 76 applies to the gate electrode 66 such a predetermined sense voltage that a conductive state occurs in the state of FIG. 8 (a) and a non-conductive state occurs in the state of FIG. 8 (b) between the source and the drain. Consequently, the transistor is rendered conductive in a writing state, while being rendered non-conductive in an erasing state. Accordingly, a current is applied to, for example, the drain to examine whether or not the current is detected in the information detecting circuit 27 connected to the side of the source, thereby to make it possible to read out the information.

As described in the foregoing, in the thin film field effect transistor constituting the memory device according to the present embodiment, the ferroelectric film 65 is stacked on the silicon carbide layer 64 for connecting the N+-type polysilicon films 63A and 63B, and the channel is formed on the silicon carbide layer 64. The rate of diffusion of a metal or oxygen included in a ferroelectric substance in silicon carbide is much lower, that is, 1/10 to 1/1000, as compared with that in silicon. Even at the time of heat treatment in the device formation process, therefore, the metal or the oxygen in the ferroelectric film 65 is not diffused in the silicon carbide layer 64. Consequently, in the above-mentioned field effect transistor so adapted that the silicon carbide layer 64 constitutes the channel, good FET characteristics can be achieved.

On the other hand, the lattice constant of silicon is 5.43 Å, while the lattice constant of silicon carbide is 4.36 Å. The lattice constant of silicon carbide is very similar to the lattice constant of PZT (4.08 to 4.12 Å). Consequently, if the ferroelectric film 65 is composed of PZT, hysteresis and reversing characteristic of polarization in the ferroelectric film become significantly good, thereby to make it possible to achieve a good storing operation. That is, the polarization in the ferroelectric film 65 can be reversed at low voltage and low power.

Furthermore, in the present embodiment, the source and the drain are constituted by polysilicon films 63A and 63B. It is easy to control the conductivity type by the diffusion of impurities into the polysilicon films 63A and 63B. Therefore, it is not difficult to form the device. That is, the source and the drain requiring the diffusion of impurities at a high concentration are constituted by a polysilicon film because it is difficult to control the conductivity type by the diffusion of impurities in a silicon carbide crystal.

In such a manner, the channel is constituted by the silicon carbide layer 64 to realize good FET characteristics, and the source and the drain are constituted by the polysilicon film 63 to make it easy to produce the device. It is necessary to control the conductivity type of the silicon carbide layer 64 constituting the channel region to be a P-conductivity type. Since a low impurity concentration is sufficient in the channel region, however, it is not difficult to control the conductivity type of the silicon carbide layer 64.

Furthermore, the polysilicon film 63 serving as the source and the drain is insulated from the silicon substrate 61 by the silicon oxide film 62. Since no PN junction is formed between the substrate and the source and drain, therefore, parasitic capacitance is reduced. As a result, power can be prevented from being wasted, thereby to make it possible to drive the device at low power. In addition, the parasitic capacitance is reduced, thereby to make it possible to increase the operation speed of the device. Furthermore, as a result of the separation of the device from the substrate, the device is not affected by the operation of another device formed on the same substrate.

Figure 9A:
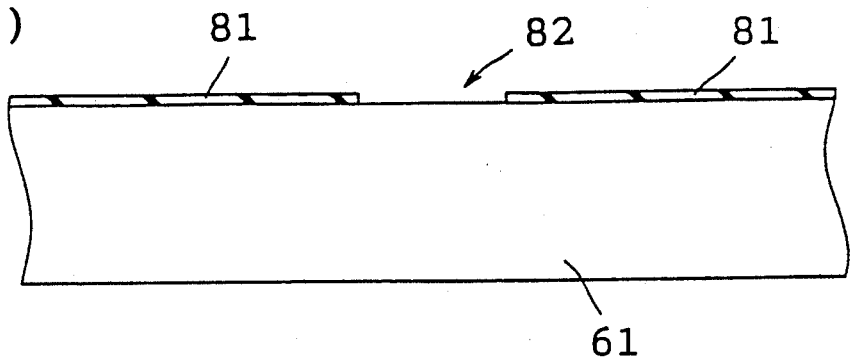
FIGS. 9 (a) to 9 (d) are cross sectional views showing the sequential steps of a method of manufacturing the abovementioned nonvolatile memory device.
Figure 9B:
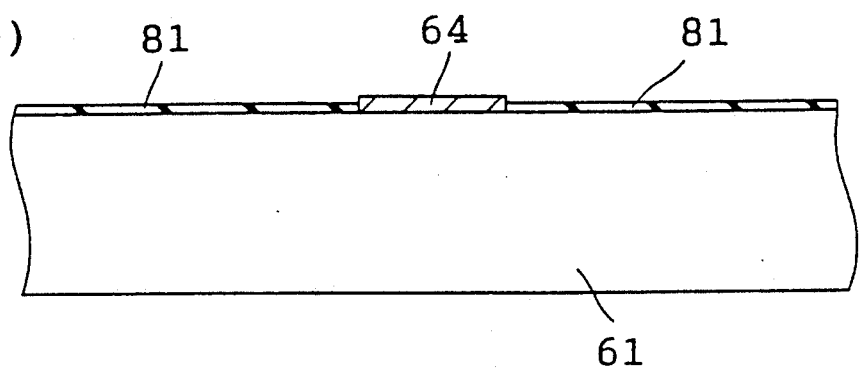
Figure 9C:
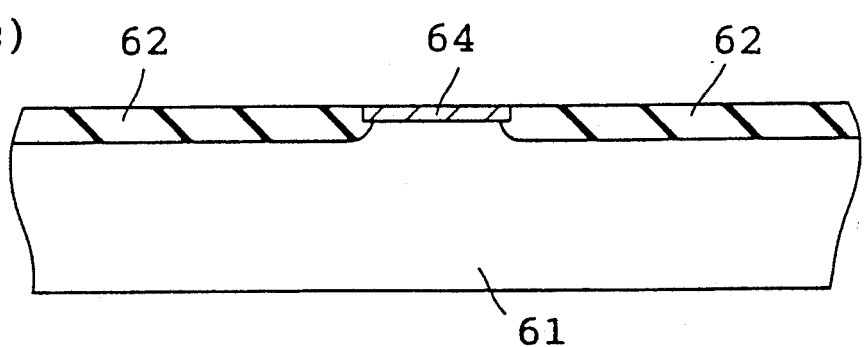
Figure 9D:
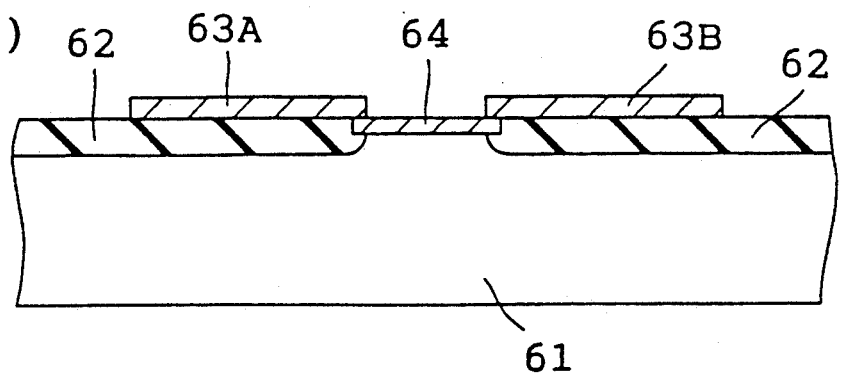
Figure 10E:
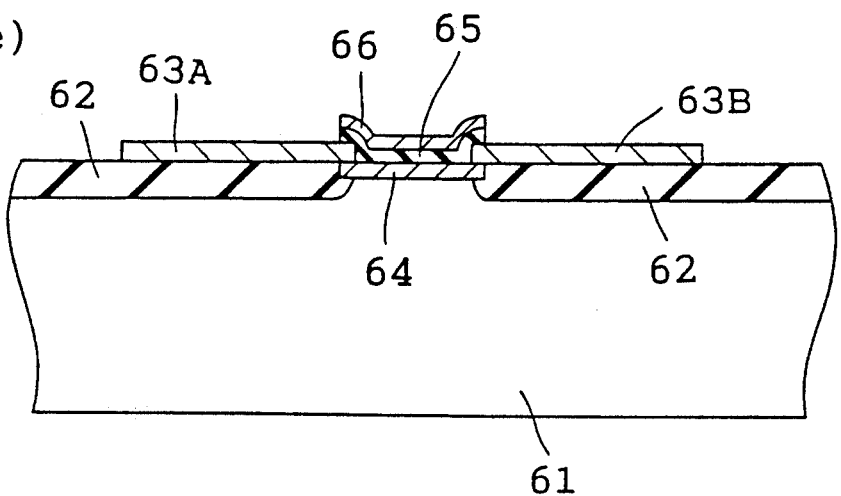
FIGS. 10 (e) and 10 (f) are cross sectional views showing the sequential steps subsequent to the step shown in FIG. 9 (d)
Figure 10F:
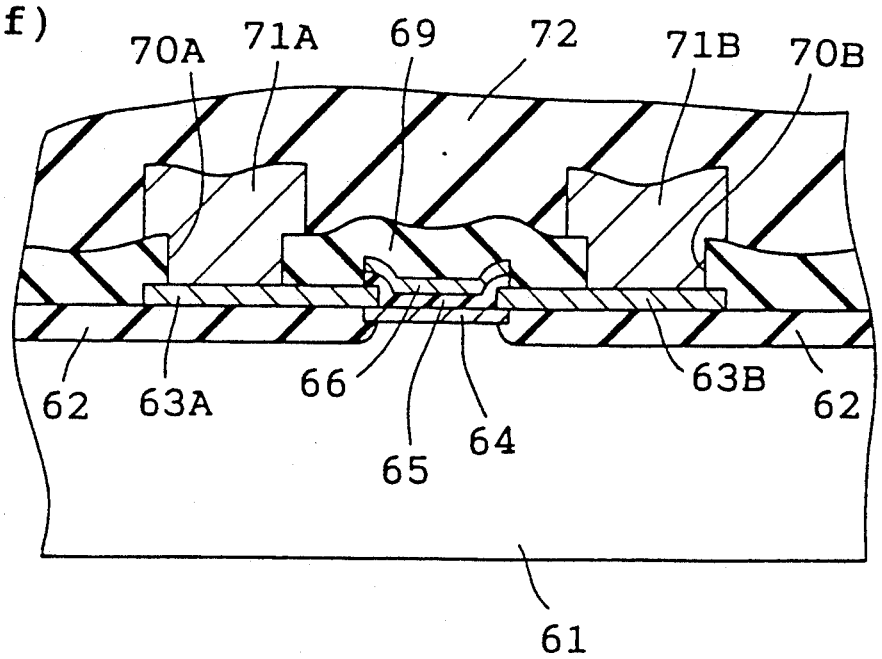

FIGS. 9 and 10 are cross sectional views showing the sequential steps of a method of manufacturing the above-mentioned nonvolatile memory device. As shown in FIG. 9 (a), a silicon oxide film as a pad oxide 81 (for example, 100 nm) is first formed on the surface of a P-type silicon substrate 61 by the thermal oxidation process. A window 82 is formed in a region where a silicon carbide layer 64 is to be formed by the photolithographic technique.

As shown in FIG. 9 (b), silicon carbide is then selectively grown, to form a P-type silicon carbide layer 64. The thickness of the silicon carbide layer 64 is, for example, 100 nm. Since silicon carbide is not easily grown on a silicon oxide film, the selective growth of the silicon carbide layer 64 in contact with the substrate 61 can be easily achieved.

As shown in FIG. 9 (c), the silicon oxide film 81 is grown utilizing the silicon carbide layer 64 as a mask, to be a silicon oxide film 62 having a thickness of, for example, 500 nm. The rate of oxidation of silicon carbide is approximately one-tenth of the rate of oxidation of silicon oxide. Accordingly, it is possible to form the thick silicon oxide film 62 in only a region other than the region where the silicon carbide layer 64 is formed. Since the thin oxide film is also formed on the surface of the silicon carbide layer 64, the oxide film on the surface of the silicon carbide layer 64 is removed by flash etching after the above-mentioned thermal oxidation.

In this state, a polysilicon film having a thickness of, for example, 200 to 300 nm is formed by the low-pressure CVD process. Phosphorous ions are then implanted, so that the above-mentioned polysilicon film is of an N+ type. After the phosphorous ions are implanted, the thermal diffusion processing of impurities is performed by annealing. The polysilicon film after the diffusion of impurities is patterned by the photolithographic technique. N+-type polysilicon films 63A and 63B are thus formed as shown in FIG. 9(d). Phosphorous ions are implanted into the silicon carbide layer 64, so that the impurity concentration of the surface thereof is controlled, to adjust the threshold value of the transistor.

As shown in FIG. 10 (e), a ferroelectric film 65 composed of, for example, PZT is then formed, and a polysilicon film 66 serving as a gate electrode is further formed on the ferroelectric film 65. The films 65 and 66 are patterned by the photolithographic technique. The ferroelectric film 65 can be formed by, for example, the sputtering process, the CVD process, and the SOL-GEL process. The thickness of the ferroelectric film 65 is, for example, 300 nm. In addition, the polysilicon film 66 is formed by, for example, the low-pressure CVD process, and the thickness thereof is, for example, 300 nm.

In the state shown in FIG. 10(e), a silicon oxide film (BPSG) 69 is then formed on the whole surface, and reflow processing is further performed so as to improve the step coverage. Contact holes 70A and 70B are formed in positions, which correspond to portions above the polysilicon films 63A and 63B, of the silicon oxide film 69. Metals 71A and 71B electrically connected to the polysilicon films 63A and 63B are formed in the contact holes 70A and 70B. The metals 71A and 71B will respectively serve as a source electrode and a drain electrode. The metals 71A and 71B are composed of, for example, aluminum. After the metals 71A and 71B are formed, a passivation film 72 is formed so as to cover the whole surface. A device shown in FIG. 10 (f) is thus completed.

Figure 11:
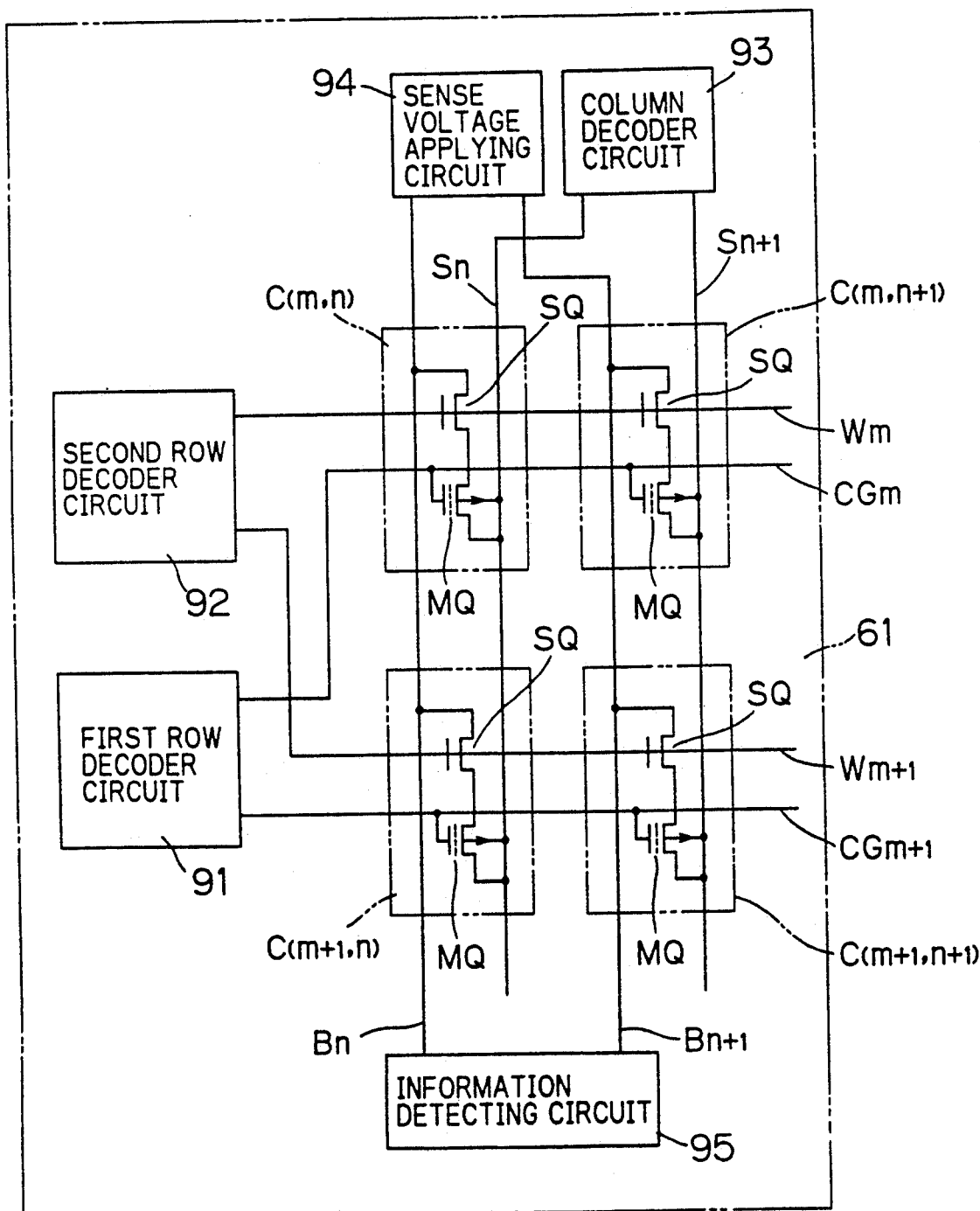
FIG. 11 is an electric circuit diagram showing the circuit arrangement of the above-mentioned nonvolatile memory device in which memory cells are arranged in a matrix manner.
Figure 12:
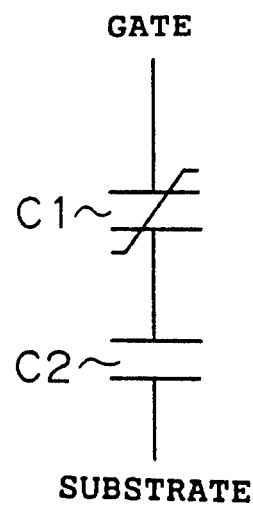
FIG. 12 is an electric circuit diagram showing an equivalent circuit formed in the vicinity of a gate in a proposed example in which a silicon oxide film is interposed between a ferroelectric film and a silicon substrate.
Figure 13A:
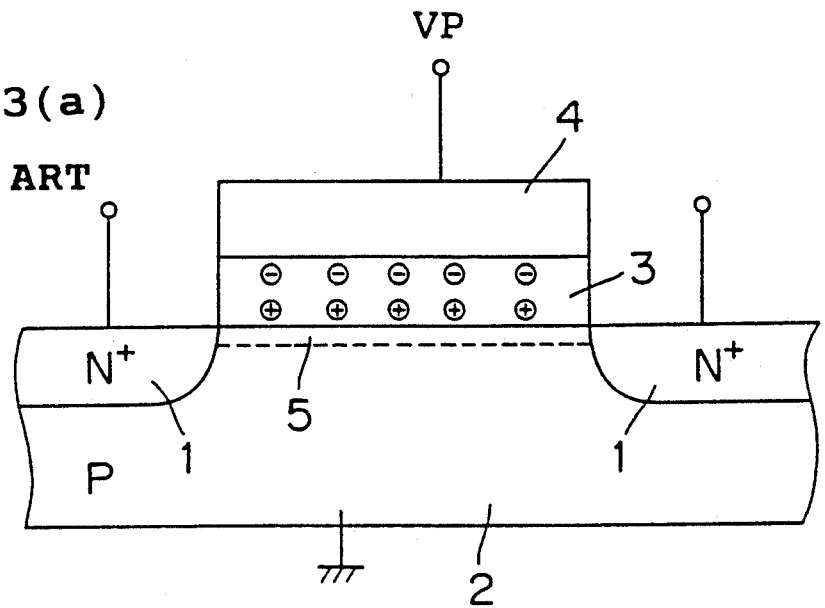
FIGS. 13 (a) and 13 (b) are diagrams showing the concept of the basic construction of the prior art.
Figure 13B:
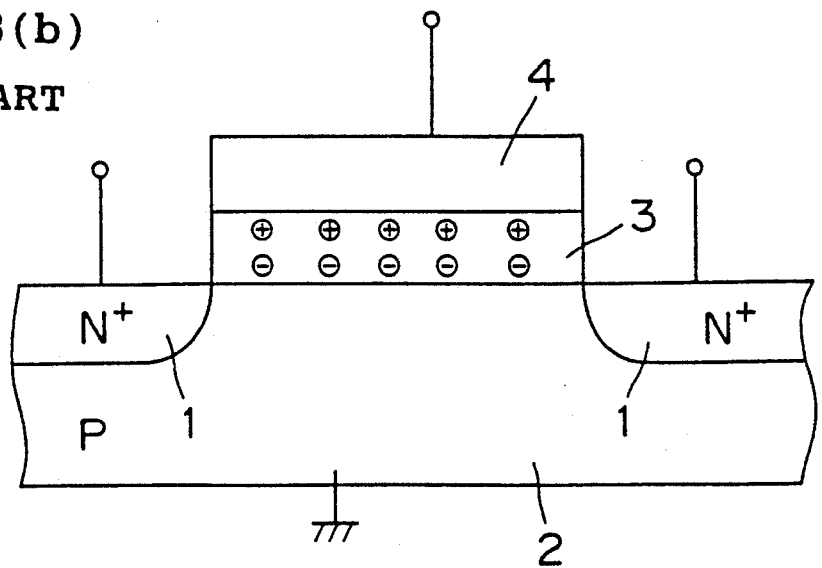

FIG. 11 is an electric circuit diagram showing the circuit arrangement of a nonvolatile memory device so constructed that a plurality of memory cells each having the above-mentioned thin film field effect transistor are arranged on the substrate 61 in a matrix manner. Four memory cells are shown in FIG. 6, however, one million memory cells or so, for example, are actually arranged on the substrate 11 in a matrix manner. Each of the memory cells comprises the above-mentioned thin film field effect transistor as a memory transistor MQ, and a selecting transistor SQ for selecting the cell.

In memory cells C (m, n) and C (m, n+1) aligned in one direction, gates of the respective selecting transistors SQ are connected together to a word line $W_m$. Similarly, in memory cells C (m+1, n) and C(m+1, n+1) aligned in the above-mentioned one direction, gates of the respective selecting transistors SQ are connected together to a word line $W_{m+1}$. In addition, gates of the respective memory transistors MQ in the memory cells C (m, n) and C (m, n+1) are connected together to a control gate line $CG_m$. Similarly, gates of the respective memory transistors MQ in the memory cells C (m+1, n) and C (m+1, n+1) are connected together to a control gate line $CG_{m+1}$.

On the other hand, in the memory cells C (m, n) and C (m +1, n) aligned in a direction intersecting the word lines $W_m$ and $W_{m+1}$, drains of the respective selecting transistors SQ are connected together to a bit line $B_n$. Similarly, in the memory cells C (m, n+1) and C (m+1, n+1) aliened in the direction intersecting the word lines $W_m$ and $W_{m+1}$, drains of the respective selecting transistors SQ are connected together to a bit line $B_{n+1}$. In addition, sources and substrates of the respective memory transistors MQ in the memory cells C (m, n) and C (m+1, n) are connected together to a source line $S_n$. Similarly, sources and substrates of the respective memory transistors MQ in the memory cells C (m, n+1) and C (m+1, n+1) are connected together to a source line $S_{n+1}$.

A voltage from a first row decoder circuit 91 is applied to the control gate lines $CG_m$ and $CG_{m+1}$. Similarly, a control voltage from a second row decoder circuit 92 is applied to the word lines $W_m$ and $W_{m+1}$. In addition, a voltage from a column decoder circuit 93 is applied to the source lines $S_n$ and $S_{n+1}$, and a voltage from a sense voltage applying circuit 94 is applied to the bit lines $B_n$ and $B_{n+1}$. The bit lines $B_n$ and $B_{n+1}$ are connected to an information detecting circuit 95.

The following table 4 collectively show voltages respectively applied to the bit lines $B_n$ and $B_{n+1}$, the source lines $S_n$ and $S_{n+1}$, the word lines $W_m$ and $W_{m+1}$, and the control gate lines $CG_m$ and $CG_{m+1}$ in cases where the memory cell C (m, n) is selected and information is written, erased and read out with respect to the memory cell C(m, n). Referring now to Table 4 and FIG. 11, description is made on operations of writing, erasing and reading out information with respect to the memory cell C (m, n). In the table 4, a sign "—" indicates that the signal line is opened or an arbitrary voltage is applied thereto.

substrate 61 and the gate 66. Consequently, the direction of polarization in the ferroelectric film 65 is aligned in the direction from the gate 66 to the substrate 61, to achieve writing of information. That is, in this state, electrons which are minority carriers are induced in the surface of the P-type silicon carbide layer 64 directly under the ferroelectric film 65, so that a channel is formed. As a result, the threshold value of the memory transistor MQ becomes low. In the present embodiment, even in a state where the control gate line $CG_m$ is brought into a ground potential level, the memory transistor MQ is rendered conductive.

The gate of the selecting transistor SQ in the memory cell C(m, n) is applied the potential equal to that of the semiconductor substrate 61 from the word line Wm. Therefore, a conductive state does not occur in the selecting transistor SQ.

The above-mentioned write voltage vp is set to a value at which the following expression holds with respect to a coercive electric field which is the lowest voltage (voltages at points B and E shown in FIG. 2) at which the direction of polarization in the ferroelectric film 65 can be reversed:

$$\frac{v_p}{2} < \text{(coercive electric field)} < v_p$$

At the time of this writing operation, in the memory cell C (m, n+1) sharing the control gate line $CG_m$ with the memory cell (m, n), the source line $S_{n+1}$ is brought into a ground potential level. Therefore, in the memory transistor MQ in the cell C (m, n+1), a voltage $\frac{1}{2} \cdot v_p$ which is one-half of the write voltage $v_p$ is only applied to the ferroelectric film 65. Accordingly, the arrangement of the polarization is not changed, so that information is not written to the memory transistor MQ. Similarly, in the memory cell C (m+1, n) sharing the source line $S_n$ with the memory cell C (m, n), the control gate line $CG_{m+1}$ is brought into a ground potential level, so that information is not written. In the memory cell C (m+1, n+1), both the control gate line $CG_{m+1}$ and the source line $S_{n+1}$ are brought into a ground potential level, so that information is not written.

The erasing operation is achieved in approximately the same manner as the writing operation. That is, the erasing operation is an operation for aligning the direction of polarization in the ferroelectric film 65 in the memory transistor MQ in the selected memory cell C (m, n) in the direction opposite to that in a writing state.

[TABLE 4]

| operation | B | | S | | W | | CG | |
|---|---|---|---|---|---|---|---|---|
| | n | n+1 | n | n+1 | m | m+1 | m | m+1 |
| write | — | — | $-\frac{v_p}{2}$ | 0 | $-\frac{v_p}{2}$ | $-\frac{v_p}{2}$ | $+\frac{v_p}{2}$ | 0 |
| erase | — | — | $+\frac{v_p}{2}$ | 0 | 0 | 0 | $-\frac{v_p}{2}$ | 0 |
| read | S | S | 0 | 0 | 5 V | 0 | 0 | 0 |

When information is written, the second row decoder circuit 92 applies $-\frac{1}{2} \cdot v_p$ to the word lines $W_m$ and $W_{m+1}$. In addition, the column decoder circuit 93 applies $-\frac{1}{2} \cdot v_p$ to the source line $S_n$. Furthermore, the first row decoder circuit 91 applies $+\frac{1}{2} \cdot v_p$ to the control gate line $CG_m$. Therefore, in the memory cell C (m, n), a write voltage $v_p$ which is plus on the side of the gate 66 is applied to the region between the semiconductor Consequently, a voltage which is opposite in polarity to that at the time of writing is applied to the control gate line $CG_m$ and the source line $S_n$, to achieve the erasing operation. In an erasing state, the threshold value of the memory transistor MQ in the memory cell C (m, n) becomes high. When the control gate line CG is brought into a ground potential level, the memory transistor MQ is rendered non-conductive.

At the time of reading out information, any of the source lines $S_n$ and $S_{n+1}$ and the control gate lines $CG_m$ and $CG_{m+1}$ are brought into a ground potential level. Consequently, the memory transistor MQ in the memory cell in a writing state is rendered conductive, while the memory transistor MQ in the memory cell in an erasing state is rendered non-conductive. In this state, a voltage (for example, 5 volts) which allows the selecting transistors SQ to be rendered conductive is applied to the word line $W_m$ corresponding to the memory cells C (m, n) and C (m, n+1) from the second row decoder circuit 92. In addition, a predetermined sense voltage S is applied to the bit lines $B_n$ and $B_{n+1}$ from the sense voltage applying circuit 94. At this time, the information detecting circuit 95 watches whether or not potentials on the bit lines $B_n$ and $B_{n+1}$ drop.

More specifically, if the memory cell C (m, n) is in a writing state, the memory transistor MQ in the memory cell C (m, n) is conductive. Therefore, the potential on the bit line $B_n$ drops to a ground potential which is a potential on the source line $S_n$. On the other hand, if the memory cell C (m, n) is in an erasing state, the memory transistor MQ in the memory cell C (m, n) is non-conductive. Therefore, the above-mentioned potential drop is not produced. Consequently, it is possible to read out information stored in the memory cell C (m, n) by watching the drop in the potential on the bit line $B_n$.

The same is true for the memory cell C (m, n+1) sharing the word line $W_m$ with the memory cell C (m, n). That is, the potentials on the bit lines $B_n$ and $B_{n+1}$ are individually watched in the information detecting circuit 95, and the sense voltage S is simultaneously applied to the respective bit lines $B_n$ and $B_{n+1}$ from the sense voltage applying circuit 94. Consequently, information from the plurality of memory cells connected to the word line $W_m$ can be read out in parallel.

In the memory cell C (m+1, n) sharing the bit line $B_n$ with the memory cell C (m, n), the word line $W_{m+1}$ is brought into a ground potential level. Therefore, no information is read out.

In the above described manner, an arbitrary memory cell is selected from the plurality of memory cells arranged in a matrix manner, thereby to make it possible to write, erase and read out information. A large capacity and electrically writable nonvolatile memory utilizing hysteresis of a ferroelectric material relative to an electric field is realized.

Meanwhile, the present invention is not limited to the above-mentioned embodiments. For example, although in the above-mentioned embodiments, description was made by taking as an example a case where PZT is used as a ferroelectric substance, other ferroelectric substances such as PLZT (lead(Pb) Lanthanum Zirconate Titanate), $LiNbO_3$, $BaMgF_4$ and the like may be applied. Also in this case, a metal or oxygen in a ferroelectric film is not diffused in a silicon carbide layer, thereby to make it possible to obtain good FET characteristics.

Furthermore, although in the above-mentioned embodiments, an N-channel field effect transistor is taken as an example, a P-channel transistor can be easily produced in the same manner.

Additionally, although in the above-mentioned embodiments, a state where the transistor is conductive is defined as a writing state and a state where the transistor is non-conductive is defined as an erasing state, it does not matter which of the states is defined as a writing state or an erasing state.

Furthermore, although in the above-mentioned second embodiment, the P-type silicon substrate 61 is used as a substrate, another arbitrary semiconductor substrate, a substrate having insulating properties or the like may be applied. When the semiconductor substrate is applied, however, it is preferable that an insulation layer is interposed between a semiconductor thin film serving as a source and a drain and the surface of the semiconductor substrate. Consequently, parasitic capacitance caused by a pn junction is reduced, thereby to achieve low power and low voltage for driving the device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a pair of high concentration impurity regions of a predetermined conductivity type serving as a source region and a drain region formed with predetermined spacing on a semiconductor substrate;
   a silicon carbide layer of a conductivity type opposite to that of said pair of high concentration impurity regions formed on the surface of said semiconductor substrate so as to connect said pair of high concentration impurity regions;
   a ferroelectric film stacked on said silicon carbide layer; and
   a gate electrode formed on said ferroelectric film, 2. The semiconductor device according to claim 1, which further comprises
   a polysilicon film formed on said pair of high concentration impurity regions, and
   a source electrode and a drain electrode electrically connected to said pair of high concentration impurity regions through the polysilicon film.

3. The semiconductor device according to claim 2, which further comprises
   a insulation film, having holes to bring said source electrode and said drain electrode into contact with said polysilicon film, for covering said polysilicon film.

4. The semiconductor device according to claim 1, wherein
   said ferroelectric film is composed of PZT.

5. The semiconductor device according to claim 1, wherein
   said semiconductor substrate is a silicon substrate.

6. A method of manufacturing a semiconductor device, comprising the steps of:
   forming, on the surface of a semiconductor substrate to be formed a pair of high concentration impurity regions of a predetermined conductivity type serving as a source region and a drain region, a silicon carbide layer of a conductivity type opposite to that of said pair of high concentration impurity regions so as to connect regions where said pair of high concentration impurity regions is to be formed;
   forming said pair of high concentration impurity regions;
   forming a ferroelectric film on said silicon carbide layer;

forming a gate electrode on said ferroelectric film; and forming a source electrode and a drain electrode so as to be electrically connected to said pair of high concentration impurity regions.

7. The method according to claim 6, wherein
step of forming said silicon carbide layer comprises the steps of forming a silicon oxide film on the surface of said semiconductor substrate, forming a hole in the region where said silicon carbide layer is to be formed in said silicon oxide film, and selectively growing a silicon carbide crystal in the hole.

8. The method according to claim 6, wherein
step of forming a polysilicon film to cover the pair of high concentration impurity regions is composed prior to said step of forming the pair of high concentration impurity regions, in said step of forming said pair of high concentration impurity regions, the step of implanting an impurity ion into said semiconductor substrate through said polysilicon film and the step of diffusing the implanted ion to form the pair of high concentration impurity regions in said semiconductor substrate and make said polysilicon film be low-resistance, and in the step of forming said source electrode and said drain electrode, the source electrode and the drain electrode are formed so as to make contact with said polysilicon layer.

9. The method according to claim 8, which further comprises the steps of forming a silicon oxide film for covering said polysilicon film and forming holes for bringing said source electrode and said drain electrode into contact with said polysilicon film prior to the step of forming said source electrode and said drain electrode.

10. The method according to claim 9, wherein
said silicon oxide film is formed by thermally oxidizing the surface of said polysilicon film.

11. The method according to claim 6, wherein
said ferroelectric film is composed of PZT.

12. The method according to claim 6, wherein
said semiconductor substrate is a silicon substrate.

13. A semiconductor memory device comprising: a memory cell comprising a field effect transistor having a pair of high concentration impurity regions of a predetermined conductivity type serving as a source region and a drain region formed with predetermined spacing on a semiconductor substrate, a silicon carbide layer of a conductivity type opposite to that of said pair of high concentration impurity regions formed on the surface of said semiconductor substrate so as to connect said pair of high concentration impurity regions, a ferroelectric film stacked on the silicon carbide layer, and a gate electrode formed on the ferroelectric film;

writing operation control means for applying an electric field in a predetermined direction to the region between the gate electrode and the semiconductor substrate to align the direction of polarization in said ferroelectric film in a predetermined direction so as to write information to said memory cell;

erasing operation control means for applying an electric filed in the direction opposite to said predetermined direction to the region between the gate electrode and the semiconductor substrate to reverse the direction of polarization in said ferroelectric film so as to erase the information written in said memory cell; and reading operation control means for examining whether the threshold value of the field effect transistor in said memory cell is higher or lower than a predetermined value so as to read out the information written in said memory cell.

14. The semiconductor memory device according to claim 13, which further comprises a selecting transistor connected in series with the field effect transistor in said memory cell, means for applying a potential equal to a potential of the semiconductor substrate to a gate of said selecting transistor when the information is written to said memory cell by said writing operation control means, means for applying a voltage for rendering the selecting transistor conductive to the gate of said selecting transistor when the information is read out from said memory cell by said reading operation control means, and information detecting means for detecting an output signal of said selecting transistor when the information is read out from said memory cell by said reading operation control means.

15. The semiconductor memory device according to claim 13, wherein said reading operation control means comprises sense voltage applying means for applying to said gate electrode of the field effect transistor in said memory cell such a predetermined sense voltage that the field effect transistor cell can be conductive when the direction of polarization in said ferroelectric film is aligned in one direction and the field effect transistor cannot be conductive when the direction polarization in said ferroelectric film is aligned in the other direction, and information detecting means for determining whether or not said field effect transistor is rendered conductive when said sense voltage is applied to the gate electrode.

16. The semiconductor memory device according to claim 13, wherein said field effect transistor in said memory cell further comprises a polysilicon film formed on said pair of high concentration impurity regions, and a source electrode and a drain electrode electrically connected to the high concentration impurity regions through said polysilicon film.

17. The semiconductor memory device according to claim 16, wherein said field effect transistor further comprises an insulation film, having holes to bring said source electrode and said drain electrode into contact with said polysilicon film, for covering said polysilicon film.

18. The semiconductor memory device according to claim 13, wherein said ferroelectric film is composed of PZT.

19. The semiconductor memory device according to claim 13, wherein said semiconductor substrate is a silicon substrate.

20. A semiconductor memory device comprising:

a plurality of memory cells arranged on a semiconductor substrate in a predetermined manner and each comprising a field effect transistor having a pair of high concentration impurity regions of a predetermined conductivity type serving as a source region and a drain region formed with predetermined spacing on the semiconductor substrate, a silicon carbide layer of a conductivity type opposite to that of said pair of high concentration impurity regions formed on the surface of said semiconductor substrate so as to connect said pair of high concentration impurity regions, a ferroelectric film stacked on the silicon carbide layer, and a gate electrode formed on the ferroelectric film;

means for selecting an arbitrary memory cell;

writing operation control means for applying an electric field in a predetermined direction to the region between the gate electrode and the semiconductor substrate in the selected memory cell to align the direction of polarization in said ferroelectric film in a predetermined direction so as to write information to said selected memory cell;

erasing operation control means for applying an electric filed in the direction opposite to said predetermined direction to the region between the gate electrode and the semiconductor substrate in the selected memory cell to reverse the direction of polarization in said ferroelectric film so as to erase the information written in said selected memory cell; and reading operation control means for examining whether the threshold value of the field effect transistor in the selected memory cell is higher or lower than a predetermined value so as to read out the information written in said selected memory cell.

21. The semiconductor memory device according to claim 20, which further comprises selecting transistors each connected in series with the field effect transistor in each of said memory cells, means for applying a potential equal to a potential of said semiconductor substrate to a gate of said selecting transistor in the selected memory cell when the information is written to said selected memory cell by said writing operation control means, means for applying a voltage for rendering the selecting transistor conductive to the gate of said selecting transistor in the selected memory cell when the information is read out from said selected memory cell by said reading operation control means, and information detecting means for detecting an output signal of said selecting transistor in the selected memory cell when the information is read out from said selected memory cell by said reading operation control means.

22. The semiconductor memory device according to claim 20, wherein said reading operation control means comprises sense voltage applying means for applying to the gate electrode of the field effect transistor in said selected memory cell such a predetermined sense voltage that the field effect transistor can be conductive when the direction of polarization in said ferroelectric film is aligned in one direction and the field effect transistor cannot be conductive when the direction of polarization in said ferroelectric film is aligned in the other direction, and information detecting means for detecting whether or not said field effect transistor is rendered conductive when said sense voltage is applied to the gate electrode.

23. The semiconductor memory device according to claim 20, wherein the field effect transistor in each of memory cells further comprises a polysilicon film formed on said pair of high concentration impurity regions, and a source electrode and a drain electrode electrically connected to said pair of high concentration impurity regions through said polysilicon film.

24. The semiconductor memory device according to claim 23, wherein said field effect transistor further comprises an insulation film, having holes to bring said source electrode and said drain electrode into contact with said polysilicon film, for covering said polysilicon film.

25. The semiconductor memory device according to claim 20, wherein said ferroelectric film is composed of PZT.

26. The semiconductor memory device according to claim 20, wherein said semiconductor substrate is a silicon substrate.

27. A Semiconductor device comprising:

a silicon carbide layer of a predetermined conductivity type formed on the surface of a substrate;

a pair of semiconductor thin films, of which conductivity type is opposite to that of the silicon carbide layer, serving as a source and a drain and formed on the surface of said substrate so as to be brought into contact with said silicon carbide layer in different positions;

a ferroelectric film stacked on said silicon carbide layer; and a gate electrode formed on said ferroelectric film.

28. The semiconductor device according to claim 27, which further comprises an insulation layer interposed between said substrate and said semiconductor thin film.

29. The semiconductor device according to claim 27, wherein said ferroelectric film is composed of PZT.

30. The semiconductor device according to claim 27, wherein said pair of semiconductor thin films is composed of a polysilicon film.

31. The semiconductor device according to claim 27, wherein said substrate is a silicon substrate.

32. A semiconductor memory device comprising:

a memory cell comprising a thin film field effect transistor having a silicon carbide layer of a predetermined conductivity type formed on the surface of a substrate, a pair of semiconductor thin films of a conductivity type opposite to that of the silicon carbide layer serving as a source and a drain and formed on the surface of said substrate so as to be brought into contact with said silicon carbide layer in different positions, a ferroelectric film stacked on said silicon carbide layer, and a gate electrode formed on said ferroelectric film;

writing operation control means for applying an electric filed in a predetermined direction to the region between the gate electrode and the substrate to align the direction of polarization in said ferroelectric film in a predetermined direction so as to write information to said memory cell;

erasing operation control means for applying an electric field in the direction opposite to said predetermined direction to the region between the gate electrode and the substrate to reverse the direction of polarization in said ferroelectric film so as to erase the information stored in said memory cell; and reading operation control means for examining whether the threshold value of said thin film field effect transistor is higher or lower than a predetermined value so as to read out the information from said memory cell.

33. The semiconductor memory device according to claim 32, which further comprises a selecting transistor connected in series with the thin film field effect transistor in said memory cell, means for applying a potential equal to a potential of said substrate to a gate of said selecting transistor when the information is written to said memory cell by said writing operation control means, means for applying a voltage for rendering the selecting transistor conductive to the gate of said selecting transistor when the information is read out from said memory cell by said reading operation control means, and information detecting means for detecting an output signal of said selecting transistor when the information is read out from said memory cell by said reading operation control means.

34. The semiconductor memory device according to claim 32, wherein said reading operation control means comprises sense voltage applying means for applying to the gate electrode of the thin film field effect transistor in said memory cell such a predetermine sense voltage that the thin film field effect transistor can be conductive when the direction of polarization in said ferroelectric film is aligned in one direction and the thin film field effect transistor cannot be conductive when the direction polarization in said ferroelectric film is aligned in the other direction, and information detecting means for detecting whether or not said thin film field effect transistor is rendered conductive when said sense voltage is applied to the gate electrode.

35. The semiconductor memory device according to claim 32, which further comprises an insulation layer interposed between said substrate and said semiconductor thin film.

36. The semiconductor memory device according to claim 32, wherein said ferroelectric film is composed of PZT.

37. The semiconductor memory device according to claim 32, wherein said pair of semiconductor thin films of said thin film field effect transistor in said memory cell is composed of a polysilicon film.

38. The semiconductor memory device according to claim 32, wherein said substrate is a silicon substrate.

39. A semiconductor memory device comprising:

a plurality of memory cells arranged in a predetermined manner and each comprising a thin film field effect transistor having a silicon carbide layer of a predetermined conductivity type formed on the surface of a substrate, a pair of semiconductor thin films of a conductivity type opposite to that of the silicon carbide layer serving as a source and a drain and formed on the surface of said substrate so as to be brought into contact with said silicon carbide layer in different positions, a ferroelectric film stacked on the silicon carbide layer, and a gate electrode formed on the ferroelectric film;

means for selecting an arbitrary memory cell;

writing operation control means for applying an electric field in a predetermined direction to the region between the gate electrode and the substrate in the selected memory cell to align the direction of polarization in said ferroelectric film in a predetermined direction so as to write information to said selected memory cell;

erasing operation control means for applying an electric filed in the direction opposite to said predetermined direction to the region between the gate electrode and the substrate in the selected memory cell to reverse the direction of polarization in said ferroelectric film so as to erase the information written in said selected memory cell; and reading operation control means for examining whether the threshold value of the thin film field effect transistor in the selected memory cell is higher or lower than a predetermined value so as to read out the information written in said selected memory cell.

40. The semiconductor memory device according to claim 39, which further comprises selecting transistors each connected in series with the thin film field effect transistor in each of said memory cells, means for applying a potential equal to a potential of said semiconductor substrate to a gate of said selecting transistor in the selected memory cell when the information is written to said selected memory cell by said writing operation control means, means for applying a voltage for rendering the selecting transistor conductive to the gate of said selecting transistor in the selected memory cell when the information is read out from said selected memory cell by said reading operation control means, and information detecting means for detecting an output signal of said selecting transistor in the selected memory cell when the information is read out from said selected memory cell by said reading operation control means.

41. The semiconductor memory device according to claim 39, wherein said reading operation control means comprises sense voltage applying means for applying to the gate electrode of the thin film field effect transistor in said selected memory cell such a predetermined sense voltage that the thin film field effect transistor can be conductive when the direction of polarization in said ferroelectric film is aligned in one direction and the thin film field effect transistor cannot be conductive when the direction polarization in said ferroelectric film is aligned in the other direction, and information detecting means for detecting whether or not said thin film field effect transistor is rendered conductive when said sense voltage is applied to the gate electrode.

42. The semiconductor memory device according to claim 39, wherein said thin film field effect transistor further comprises an insulation layer interposed between said substrate and said semiconductor thin film.

43. The semiconductor memory device according to claim 39, wherein said ferroelectric film is composed of PZT.

44. The semiconductor memory device according to claim 39, wherein said pair of semiconductor thin films of said thin film field effect transistor in each of memory cells is composed of a polysilicon film.

45. The semiconductor memory device according to claim 39, wherein said substrate is a silicon substrate.

* * * * *